US010003888B2

(12) United States Patent
Stephanou et al.

(10) Patent No.: US 10,003,888 B2
(45) Date of Patent: *Jun. 19, 2018

(54) TRANSDUCER WITH PIEZOELECTRIC, CONDUCTIVE AND DIELECTRIC MEMBRANE

(71) Applicant: SnapTrack, Inc., San Diego, CA (US)

(72) Inventors: Philip Jason Stephanou, Mountain View, CA (US); David William Burns, San Jose, CA (US); Ravindra V. Shenoy, Dublin, CA (US)

(73) Assignee: SNAPTRACK, INC, San Diego, CA (US)

( * ) Notice: Subject to any disclaimer, the term of this patent is extended or adjusted under 35 U.S.C. 154(b) by 85 days.

This patent is subject to a terminal disclaimer.

(21) Appl. No.: 14/336,744

(22) Filed: Jul. 21, 2014

(65) Prior Publication Data

US 2014/0328504 A1 Nov. 6, 2014

Related U.S. Application Data

(63) Continuation of application No. 13/306,397, filed on Nov. 29, 2011, now Pat. No. 8,811,636.

(51) Int. Cl.
H04R 17/00 (2006.01)
H04R 31/00 (2006.01)
G02B 26/00 (2006.01)

(52) U.S. Cl.
CPC ........... H04R 17/00 (2013.01); G02B 26/001 (2013.01); H04R 31/00 (2013.01);
(Continued)

(58) Field of Classification Search
CPC ........... H04R 7/04; H04R 19/00–19/01; H04R 19/013; H04R 19/016; H04R 2217/00–2217/03; H04R 2460/13
(Continued)

(56) References Cited

U.S. PATENT DOCUMENTS 3,343,256 A 9/1967 Smith et al.
3,372,070 A 3/1968 Paul
(Continued)

FOREIGN PATENT DOCUMENTS

CN 101754077 A 6/2010
JP S60260849 A 12/1985
(Continued)

OTHER PUBLICATIONS

International Preliminary Report on Patentability—PCT/US2012/066875, The International Bureau of WIPO—Geneva, Switzerland, Jan. 24, 2014.
(Continued)

Primary Examiner — Suhan Ni
(74) Attorney, Agent, or Firm — Weaver Austin Villeneuve & Sampson LLP—QUAL

(57) ABSTRACT

This disclosure provides systems, methods and apparatus for microspeaker devices. In one aspect, a microspeaker element may include a deformable dielectric membrane that spans a speaker cavity. The deformable dielectric membrane can include a piezoactuator and a dielectric layer. Upon application of a driving signal to the piezoactuator, the dielectric layer can deflect, producing sound. In some implementations, an array of microspeaker elements can be encapsulated between a glass substrate and a cover glass. Sound generated by the microspeaker elements can be emitted through a speaker grill formed in the cover glass.

20 Claims, 25 Drawing Sheets

(52) U.S. Cl.
CPC .. *H04R 2201/003* (2013.01); *H04R 2201/401* (2013.01); *H04R 2499/15* (2013.01); *Y10T 29/42* (2015.01)

(58) Field of Classification Search
USPC ............................... 381/151, 190–191, 431
See application file for complete search history.

(56) References Cited

U.S. PATENT DOCUMENTS

| | | | |
|---|---|---|---|
| 3,462,650 A | | 8/1969 | Hennings et al. |
| 3,648,131 A | | 3/1972 | Stuby |
| 3,849,679 A | * | 11/1974 | Massa .................... H04R 17/10 310/324 |
| 4,258,468 A | | 3/1981 | Balde |
| 4,283,649 A | * | 8/1981 | Heinouchi ............ B06B 1/0603 381/190 |
| 4,368,400 A | * | 1/1983 | Taniguchi .............. G10K 9/122 381/190 |
| 4,445,978 A | | 5/1984 | Whartenby et al. |
| 4,458,170 A | * | 7/1984 | Takayama .............. G10K 9/122 381/190 |
| 4,461,930 A | * | 7/1984 | Melillo .................... H04R 7/10 181/168 |
| 4,475,014 A | * | 10/1984 | King ....................... H01L 41/29 310/332 |
| 4,485,322 A | * | 11/1984 | Yasuda ................. B06B 1/0603 381/190 |
| 4,754,440 A | * | 6/1988 | Naruse ................. B06B 1/0666 381/190 |
| 4,850,227 A | | 7/1989 | Luettgen et al. |
| 5,295,395 A | | 3/1994 | Hocker et al. |
| 5,422,190 A | | 6/1995 | Alexander |
| 5,510,655 A | | 4/1996 | Tanielian |
| 5,511,428 A | | 4/1996 | Goldberg et al. |
| 5,569,958 A | | 10/1996 | Bloom |
| 5,683,594 A | | 11/1997 | Hocker et al. |
| 5,841,099 A | | 11/1998 | Owen et al. |
| 5,852,337 A | | 12/1998 | Takeuchi et al. |
| 6,057,602 A | | 5/2000 | Hudson et al. |
| 6,076,726 A | | 6/2000 | Hoffmeyer et al. |
| 6,114,240 A | | 9/2000 | Akram et al. |
| 6,147,397 A | | 11/2000 | Burns et al. |
| 6,207,905 B1 | | 3/2001 | Taga et al. |
| 6,221,769 B1 | | 4/2001 | Dhong et al. |
| 6,229,190 B1 | | 5/2001 | Bryzek et al. |
| 6,255,728 B1 | | 7/2001 | Nasiri et al. |
| 6,268,660 B1 | | 7/2001 | Dhong et al. |
| 6,280,641 B1 | | 8/2001 | Gaku et al. |
| 6,346,742 B1 | | 2/2002 | Bryzek et al. |
| 6,351,996 B1 | | 3/2002 | Nasiri et al. |
| 6,400,009 B1 | | 6/2002 | Bishop et al. |
| 6,423,905 B1 | | 7/2002 | Brodsky et al. |
| 6,559,487 B1 | | 5/2003 | Kang et al. |
| 6,559,530 B2 | | 5/2003 | Hinzel et al. |
| 6,589,594 B1 | | 7/2003 | Hembree |
| 6,599,833 B2 | | 7/2003 | Farquhar et al. |
| 6,600,214 B2 | | 7/2003 | Ishikawa et al. |
| 6,690,032 B1 | | 2/2004 | Umetsu |
| 6,696,758 B2 | | 2/2004 | Dubin et al. |
| 6,777,263 B1 | | 8/2004 | Gan et al. |
| 6,829,937 B2 | | 12/2004 | Mahon |
| 6,836,020 B2 | | 12/2004 | Cheng et al. |
| 6,846,725 B2 | | 1/2005 | Nagarajan et al. |
| 6,857,501 B1 | | 2/2005 | Han et al. |
| 6,888,233 B2 | | 5/2005 | Horning et al. |
| 6,910,268 B2 | | 6/2005 | Miller |
| 6,912,078 B2 | | 6/2005 | Kudrle et al. |
| 6,953,985 B2 | | 10/2005 | Lin et al. |
| 6,964,882 B2 | | 11/2005 | Yun et al. |
| 6,977,224 B2 | | 12/2005 | Dubin et al. |
| 7,029,829 B2 | | 4/2006 | Stark et al. |
| 7,098,117 B2 | | 8/2006 | Najafi et al. |
| 7,151,837 B2 | | 12/2006 | Bank et al. |
| 7,167,570 B2 | * | 1/2007 | Kobayashi ............ H04R 17/00 381/152 |
| 7,184,202 B2 | | 2/2007 | Miles et al. |
| 7,217,588 B2 | | 5/2007 | Hartzell et al. |
| 7,263,883 B2 | | 9/2007 | Park et al. |
| 7,291,833 B2 | | 11/2007 | Sherrer et al. |
| 7,348,550 B2 | | 3/2008 | Sherrer et al. |
| 7,355,166 B2 | | 4/2008 | Sherrer et al. |
| 7,357,017 B2 | | 4/2008 | Felton et al. |
| 7,569,410 B2 | | 8/2009 | Hartzell et al. |
| 7,569,421 B2 | | 8/2009 | Do et al. |
| 7,591,185 B1 | | 9/2009 | Mothilal et al. |
| 7,596,235 B2 | * | 9/2009 | Michiels ................ H04R 17/00 381/152 |
| 7,709,999 B2 | | 5/2010 | Itaya et al. |
| 7,736,946 B2 | | 6/2010 | Seppala et al. |
| 7,791,434 B2 | | 9/2010 | Fazzio et al. |
| 7,812,505 B2 | | 10/2010 | Lee et al. |
| 8,275,158 B2 | * | 9/2012 | Kim ....................... H04R 17/00 381/190 |
| 8,280,080 B2 | * | 10/2012 | Philliber ............... H04R 31/00 381/171 |
| 8,492,957 B2 | * | 7/2013 | Toda ........................ H02N 2/18 181/158 |
| 2002/0125793 A1 | | 9/2002 | Yun et al. |
| 2002/0130589 A1 | | 9/2002 | Hamada et al. |
| 2002/0146200 A1 | | 10/2002 | Kudrle et al. |
| 2002/0196952 A1 | * | 12/2002 | Liao ....................... H04R 17/00 381/190 |
| 2003/0048914 A1 | | 3/2003 | Yi et al. |
| 2003/0137056 A1 | | 7/2003 | Taniguchi et al. |
| 2003/0202672 A1 | | 10/2003 | Yamauchi et al. |
| 2004/0028849 A1 | | 2/2004 | Stark et al. |
| 2004/0092105 A1 | | 5/2004 | Lee et al. |
| 2004/0217455 A1 | | 11/2004 | Shiono et al. |
| 2005/0105245 A1 | | 5/2005 | Kuisma et al. |
| 2005/0134401 A1 | | 6/2005 | Song et al. |
| 2006/0127640 A1 | | 6/2006 | Kobayashi et al. |
| 2006/0141650 A1 | | 6/2006 | Kim et al. |
| 2006/0231961 A1 | | 10/2006 | Shibayama et al. |
| 2007/0000323 A1 | | 1/2007 | Kuisma |
| 2007/0099327 A1 | | 5/2007 | Hartzell et al. |
| 2007/0110264 A1 | * | 5/2007 | Bachmann ............ H04R 5/023 381/152 |
| 2007/0252485 A1 | | 11/2007 | Kawakubo et al. |
| 2007/0284971 A1 | | 12/2007 | Sano et al. |
| 2008/0006850 A1 | | 1/2008 | Ribnicek et al. |
| 2008/0067073 A1 | | 3/2008 | Kagawa et al. |
| 2008/0212807 A1 | * | 9/2008 | Wang ..................... H04R 1/227 381/190 |
| 2008/0257591 A1 | | 10/2008 | Ikeda |
| 2009/0049670 A1 | | 2/2009 | Barber et al. |
| 2009/0154735 A1 | | 6/2009 | Kim et al. |
| 2010/0068453 A1 | | 3/2010 | Imai et al. |
| 2010/0156238 A1 | | 6/2010 | Kim et al. |
| 2011/0005326 A1 | | 1/2011 | Bentley et al. |
| 2011/0064250 A1 | | 3/2011 | Jeong et al. |
| 2011/0227937 A1 | | 9/2011 | Todorovich |
| 2013/0136280 A1 | | 5/2013 | Stephanou et al. |
| 2017/0125660 A1 | | 5/2017 | Stephanou et al. |

FOREIGN PATENT DOCUMENTS

| | | |
|---|---|---|
| JP | H08-265816 | 10/1996 |
| JP | 2000124764 A | 4/2000 |
| JP | 2000-217195 A | 8/2000 |
| JP | 2004-007400 A | 1/2004 |
| JP | 2006270770 A | 10/2006 |
| JP | 2007181087 A | 7/2007 |
| JP | 2008-199266 A | 8/2008 |
| JP | 2009-260723 A | 11/2009 |
| JP | 2010-081573 A | 4/2010 |
| JP | 2010-148102 A | 7/2010 |

(56) References Cited

FOREIGN PATENT DOCUMENTS

JP      A2011066876 A    3/2011
WO    WO-2010137242 A    12/2010

OTHER PUBLICATIONS

International Search Report and Written Opinion—PCT/US2012/066875—ISA/EPO—Feb. 12, 2013.
Second Written Opinion from International Application No. PCT/US2012/066875, dated Oct. 31, 2013, 4 Pages.
U.S. Office Action received in U.S. Appl. No. 13/306,397, dated Dec. 19, 2013.
U.S. Notice of Allowance received in U.S. Appl. No. 13/306,397, dated Apr. 14, 2014.
Khine L et al., "Piezoelectric ALN MEMS resonators with high coupling coefficient," 2011 16th International Solid-State Sensors, Actuators and Microsystems Conference (Transducer 2011); Beijing, China, Jun. 5-9, 2011, IEEE, Piscataway NJ, Jun. 5, 2011 (Jun. 5, 2011), pp. 526-529 XP031910981, DOI:10.1109/Transducer.2011.5969674 ISBN: 978-1-4577-0157-3.
EP Office Action issued on Jul. 20, 2015, in Application No. 12805839.3.
JP Office Action issued on Jul. 13, 2015, in Application No. 2014-544851.
JP Office Action dated May 9, 2016, in Application No. 2014-544851.

\* cited by examiner

Common Voltages

| Segment Voltages | $VC_{ADD\_H}$ | $VC_{HOLD\_H}$ | $VC_{REL}$ | $VC_{HOLD\_L}$ | $VC_{ADD\_L}$ |
|---|---|---|---|---|---|
| $VS_H$ | Stable | Stable | Relax | Stable | Actuate |
| $VS_L$ | Actuate | Stable | Relax | Stable | Stable |

400

402 — Form a Sacrificial Layer on a Substrate

404 — Form a Piezoactuator over the Sacrifical Layer

406 — Form a Dielectric Layer over the Sacrificial Layer

408 — Remove the Sacrificial Layer

Figure 18

TRANSDUCER WITH PIEZOELECTRIC, CONDUCTIVE AND DIELECTRIC MEMBRANE

CROSS-REFERENCE TO RELATED APPLICATION

This application is a continuation of and claims priority to U.S. patent application Ser. No. 13/306,397, filed on Nov. 29, 2011 and entitled "MICROSPEAKER WITH PIEZO-ELECTRIC, METAL AND DIELECTRIC MEMBRANE," which is incorporated herein by this reference and for all purposes.

TECHNICAL FIELD

This disclosure relates to electromechanical system devices and more particularly to electromechanical microspeaker devices.

DESCRIPTION OF THE RELATED TECHNOLOGY

Electromechanical systems (EMS) include devices having electrical and mechanical elements, actuators, transducers, sensors, optical components (including mirrors) and electronics. Electromechanical systems can be manufactured at a variety of scales including, but not limited to, microscales and nanoscales. For example, microelectromechanical systems (MEMS) devices can include structures having sizes ranging from about a micron to hundreds of microns or more. Nanoelectromechanical systems (NEMS) devices can include structures having sizes smaller than a micron including, for example, sizes smaller than several hundred nanometers. Electromechanical elements may be created using deposition, etching, lithography, and/or other micromachining processes that etch away parts of substrates and/or deposited material layers, or that add layers to form electrical and electromechanical devices.

One type of EMS device is called an interferometric modulator (IMOD). The term interferometric modulator or interferometric light modulator refers to a device that selectively absorbs and/or reflects light using the principles of optical interference. In some implementations, an IMOD may include a pair of conductive plates, one or both of which may be transparent and/or reflective, wholly or in part, and capable of relative motion upon application of an appropriate electrical signal. For example, one plate may include a stationary layer deposited on a substrate and the other plate may include a reflective membrane separated from the stationary layer by an air gap. The position of one plate in relation to another can change the optical interference of light incident on the IMOD. IMOD devices have a wide range of applications, and are anticipated to be used in improving existing products and creating new products, especially those with display capabilities.

Another type of EMS device is a microspeaker. A microspeaker can convert electrical signals into sound waves.

SUMMARY

The systems, methods and devices of the disclosure each have several innovative aspects, no single one of which is solely responsible for the desirable attributes disclosed herein.

One innovative aspect of the subject matter described in this disclosure can be implemented in a microspeaker element. The microspeaker element may include a deformable dielectric membrane that spans a speaker cavity. The deformable dielectric membrane may include a piezoactuator and a dielectric layer. Upon application of a driving signal to the piezoactuator, the dielectric layer can deflect, producing sound. In some implementations, an array of microspeaker elements may be encapsulated between a glass substrate and a cover glass. Sound generated by the microspeaker elements can be emitted through a speaker grill formed in the cover glass.

Another innovative aspect of the subject matter described in this disclosure can be implemented in an apparatus including a substrate, a deformable membrane, and a speaker cavity disposed between the substrate and the deformable membrane such that the deformable membrane spans the speaker cavity. The deformable membrane may include a first piezoelectric layer sandwiched between first and second metal layers. The deformable membrane may further include a dielectric layer configured to deform on application of a drive voltage across the first piezoelectric layer.

In some implementations, the first piezoelectric layer may be disposed between the dielectric layer and the substrate. In some implementations, the dielectric layer may be disposed between the first piezoelectric layer and the substrate. The first piezoelectric layer may have various configurations. For example, the first piezoelectric layer may span the speaker cavity or overlie only a portion of the speaker cavity according to the desired implementation. In some implementations, the first piezoelectric layer overlies a peripheral region of the speaker cavity. In some implementations, the first piezoelectric layer is centered over the speaker cavity.

The deformable membrane may further include a second piezoelectric layer sandwiched between third and fourth metal layers. In some implementations, the first and second piezoelectric layers may be located on opposite sides of the dielectric layer.

The apparatus may include a display and a processor that is configured to communicate with the display. The processor may be configured to process image data. The apparatus may include a memory device that is configured to communicate with the processor. The apparatus may include a driver circuit configured to send at least one signal to the display and a controller configured to send at least a portion of the image data to the driver circuit. The apparatus may include an image source module configured to send the image data to the processor. The image source module may include at least one of a receiver, transceiver, and transmitter. The apparatus may include an input device configured to receive input data and to communicate the input data to the processor.

Another innovative aspect of the subject matter described in this disclosure can be implemented in an apparatus including an array of piezoactuated microspeaker elements. The array may be formed between first and second joined glass substrates. Each piezoactuated microspeaker element may include a speaker cavity and a deformable membrane spanning the speaker cavity. The deformable membrane may include a first piezoelectric layer sandwiched between first and second metal layers. The deformable membrane may further include a dielectric layer configured to deform on application of a drive voltage across the piezoelectric layer. The apparatus may include one or more acoustic ports formed in a glass substrate and disposed over the array. The apparatus may include an integrated circuit device positioned in a cavity between the first and second glass substrates. The integrated circuit may be configured to drive the piezoactuated microspeaker elements. The joined glass substrates may be configured to attach to a flexible connector.

Yet another innovative aspect of the subject matter described in this disclosure can be implemented in a method of forming a microspeaker. The method may include forming a sacrificial layer on a substrate, forming a first piezoactuator over the sacrificial layer, forming a deformable dielectric layer over the sacrificial layer and the substrate, and removing the sacrificial layer to form a speaker cavity between the substrate and the deformable dielectric layer such that deformable dielectric layer spans the speaker cavity. The method may include forming a second piezoactuator over the sacrificial layer. In some implementations, forming the first piezoactuator over the sacrificial layer may include forming a first metal layer over the sacrificial layer, forming a first piezoelectric layer over the first metal layer, and forming a second metal layer over the first piezoelectric layer.

Details of one or more implementations of the subject matter described in this specification are set forth in the accompanying drawings and the description below. Although the examples provided in this disclosure are primarily described in terms of electromechanical systems (EMS) and microelectromechanical systems (MEMS)-based displays, the concepts provided herein may apply to other types of displays, such as liquid crystal displays, organic light-emitting diode ("OLED") displays and field emission displays. Other features, aspects, and advantages will become apparent from the description, the figures and the claims. Note that the relative dimensions of the following figures may not be drawn to scale.

BRIEF DESCRIPTION OF THE DRAWINGS

FIG. 18 shows an example of a flow diagram illustrating a manufacturing process for a microspeaker element.

Like reference numbers and designations in the various drawings indicate like elements.

DETAILED DESCRIPTION

Figure 1:
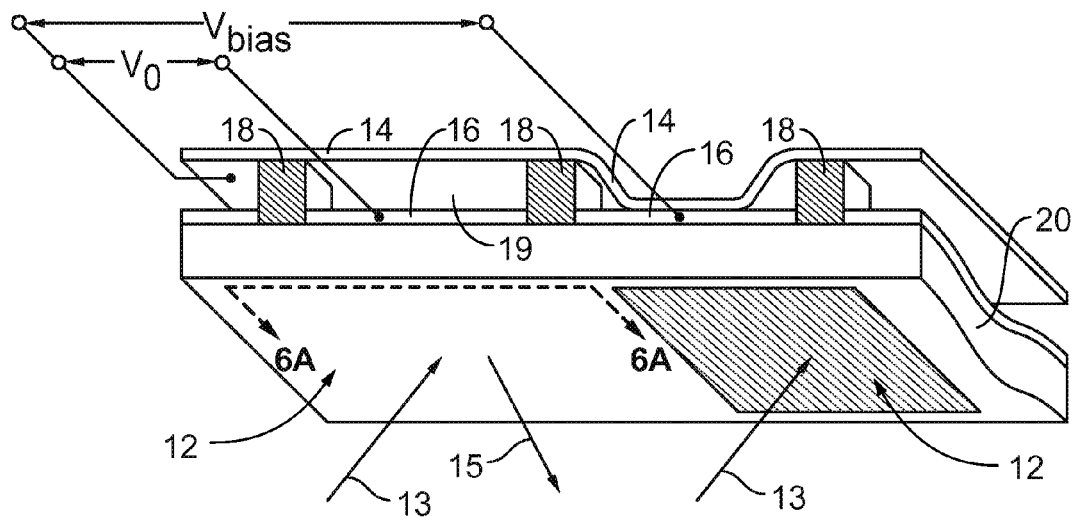
FIG. 1 shows an example of an isometric view depicting two adjacent pixels in a series of pixels of an interferometric modulator (IMOD) display device.

The following description is directed to certain implementations for the purposes of describing the innovative aspects of this disclosure. However, a person having ordinary skill in the art will readily recognize that the teachings herein can be applied in a multitude of different ways. The described implementations may be implemented in any device or system that can be configured to display an image, whether in motion (e.g., video) or stationary (e.g., still image), and whether textual, graphical or pictorial. More particularly, it is contemplated that the described implementations may be included in or associated with a variety of electronic devices such as, but not limited to: mobile telephones, multimedia Internet enabled cellular telephones, mobile television receivers, wireless devices, smartphones, Bluetooth® devices, personal data assistants (PDAs), wireless electronic mail receivers, hand-held or portable computers, netbooks, notebooks, smartbooks, tablets, printers, copiers, scanners, facsimile devices, GPS receivers/navigators, cameras, MP3 players, camcorders, game consoles, wrist watches, clocks, calculators, television monitors, flat panel displays, electronic reading devices (i.e., e-readers), computer monitors, auto displays (including odometer and speedometer displays, etc.), cockpit controls and/or displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (such as in electromechanical systems (EMS), microelectromechanical systems (MEMS) and non-MEMS applications), aesthetic structures (e.g., display of images on a piece of jewelry) and a variety of EMS devices. The teachings herein also can be used in non-display applications such as, but not limited to, electronic switching devices, radio frequency filters, sensors, accelerometers, gyroscopes, motion-sensing devices, magnetometers, inertial components for consumer electronics, parts of consumer electronics products, varactors, liquid crystal devices, electrophoretic devices, drive schemes, manufacturing processes and electronic test equipment. Thus, the teachings are not intended to be limited to the implementations depicted solely in the Figures, but instead have wide applicability as will be readily apparent to one having ordinary skill in the art.

Some implementations described herein relate to electromechanical microspeaker elements. In some implementations, a microspeaker element includes a speaker cavity disposed between a substrate and a deformable dielectric membrane. The deformable dielectric membrane can include a dielectric layer and one or more piezoactuators. Each piezoactuator can include at least one piezoelectric layer and electrodes to which a drive signal can be applied.

The drive signal can deflect the piezoelectric layer, which deflects the dielectric layer thereby producing sound.

Some implementations described herein relate to glass-encapsulated microspeakers. In some implementations, a glass-encapsulated microspeaker includes a glass substrate, an array of electromechanical microspeaker elements disposed on the glass substrate, and a cover glass. The cover glass may be bonded to the glass substrate with an adhesive, such as epoxy, glass frit, or a metal bond ring. The cover glass may include a recess that forms a cavity when the cover glass is bonded to the surface of the glass substrate. The cover glass also may include a speaker grill disposed over the array of microspeaker elements to allow sound waves to be emitted from the array of microspeaker elements.

Particular implementations of the subject matter described in this disclosure can be implemented to realize one or more of the following potential advantages. In some implementations, low cost, small size, low profile, and low power consumption microspeakers are provided. Further, microspeakers that are fabricated on glass substrates can be compatible with displays and other devices that are also fabricated on glass substrates, as the microspeakers can either be fabricated jointly with the other devices or attached as a separate device, the combination having well-matched thermal expansion properties. The materials employed can result in a high thermal budget that enables reflow or wave soldering to attach the device to a printed circuit board.

The glass lid and glass substrate of a joined microspeaker can be thermally well matched. One or more acoustic ports in the top, sides, or bottom provide flexibility when mounting the sensor, such as when mounting in a mobile phone to serve as a speaker or in a speaker array. Through-glass vias in some implementations allow direct connection of the microspeaker to a printed circuit or wiring board. In some implementations, a flexible connector is attachable to the microspeaker, allowing electrical connection to a PCB while allowing the microspeaker to be positioned near an exterior wall or face of an enclosure such as a mobile phone case.

An example of a suitable EMS or MEMS device, to which the described implementations may apply, is a reflective display device. Reflective display devices can incorporate interferometric modulators (IMODs) to selectively absorb and/or reflect light incident thereon using principles of optical interference. IMODs can include an absorber, a reflector that is movable with respect to the absorber, and an optical resonant cavity defined between the absorber and the reflector. The reflector can be moved to two or more different positions, which can change the size of the optical resonant cavity and thereby affect the reflectance of the IMOD. The reflectance spectrums of IMODs can create fairly broad spectral bands which can be shifted across the visible wavelengths to generate different colors. The position of the spectral band can be adjusted by changing the thickness of the optical resonant cavity. One way of changing the optical resonant cavity is by changing the position of the reflector.

FIG. 1 shows an example of an isometric view depicting two adjacent pixels in a series of pixels of an interferometric modulator (IMOD) display device. The IMOD display device includes one or more interferometric MEMS display elements. In these devices, the pixels of the MEMS display elements can be in either a bright or dark state. In the bright ("relaxed," "open" or "on") state, the display element reflects a large portion of incident visible light, e.g., to a user. Conversely, in the dark ("actuated," "closed" or "off") state, the display element reflects little incident visible light. In some implementations, the light reflectance properties of the on and off states may be reversed. MEMS pixels can be configured to reflect predominantly at particular wavelengths allowing for a color display in addition to black and white.

The IMOD display device can include a row/column array of IMODs. Each IMOD can include a pair of reflective layers, i.e., a movable reflective layer and a fixed partially reflective layer, positioned at a variable and controllable distance from each other to form an air gap (also referred to as an optical gap or cavity). The movable reflective layer may be moved between at least two positions. In a first position, i.e., a relaxed position, the movable reflective layer can be positioned at a relatively large distance from the fixed partially reflective layer. In a second position, i.e., an actuated position, the movable reflective layer can be positioned more closely to the partially reflective layer. Incident light that reflects from the two layers can interfere constructively or destructively depending on the position of the movable reflective layer, producing either an overall reflective or non-reflective state for each pixel. In some implementations, the IMOD may be in a reflective state when unactuated, reflecting light within the visible spectrum, and may be in a dark state when unactuated, reflecting light outside of the visible range (e.g., infrared light). In some other implementations, however, an IMOD may be in a dark state when unactuated, and in a reflective state when actuated. In some implementations, the introduction of an applied voltage can drive the pixels to change states. In some other implementations, an applied charge can drive the pixels to change states.

The depicted portion of the pixel array in FIG. 1 includes two adjacent IMODs 12. In the IMOD 12 on the left (as illustrated), a movable reflective layer 14 is illustrated in a relaxed position at a predetermined distance from an optical stack 16, which includes a partially reflective layer. The voltage $V_0$ applied across the IMOD 12 on the left is insufficient to cause actuation of the movable reflective layer 14. In the IMOD 12 on the right, the movable reflective layer 14 is illustrated in an actuated position near or adjacent the optical stack 16. The voltage $V_{bias}$ applied across the IMOD 12 on the right is sufficient to maintain the movable reflective layer 14 in the actuated position.

In FIG. 1, the reflective properties of pixels 12 are generally illustrated with arrows 13 indicating light incident upon the pixels 12, and light 15 reflecting from the pixel 12 on the left. Although not illustrated in detail, it will be understood by one having ordinary skill in the art that most of the light 13 incident upon the pixels 12 will be transmitted through the transparent substrate 20, toward the optical stack 16. A portion of the light incident upon the optical stack 16 will be transmitted through the partially reflective layer of the optical stack 16, and a portion will be reflected back through the transparent substrate 20. The portion of light 13 that is transmitted through the optical stack 16 will be reflected at the movable reflective layer 14, back toward (and through) the transparent substrate 20. Interference (constructive or destructive) between the light reflected from the partially reflective layer of the optical stack 16 and the light reflected from the movable reflective layer 14 will determine the wavelength(s) of light 15 reflected from the pixel 12.

The optical stack 16 can include a single layer or several layers. The layer(s) can include one or more of an electrode layer, a partially reflective and partially transmissive layer and a transparent dielectric layer. In some implementations, the optical stack 16 is electrically conductive, partially transparent and partially reflective, and may be fabricated, for example, by depositing one or more of the above layers onto a transparent substrate 20. The electrode layer can be formed from a variety of materials, such as various metals, for example indium tin oxide (ITO). The partially reflective layer can be formed from a variety of materials that are partially reflective, such as various metals, such as chromium (Cr), semiconductors, and dielectrics. The partially reflective layer can be formed of one or more layers of materials, and each of the layers can be formed of a single material or a combination of materials. In some implementations, the optical stack 16 can include a single semi-transparent thickness of metal or semiconductor which serves as both an optical absorber and conductor, while different, more conductive layers or portions (e.g., of the optical stack 16 or of other structures of the IMOD) can serve to bus signals between IMOD pixels. The optical stack 16 also can include one or more insulating or dielectric layers covering one or more conductive layers or a conductive/absorptive layer.

In some implementations, the layer(s) of the optical stack 16 can be patterned into parallel strips, and may form row electrodes in a display device as described further below. As will be understood by one having skill in the art, the term "patterned" is used herein to refer to masking as well as etching processes. In some implementations, a highly conductive and reflective material, such as aluminum (Al), may be used for the movable reflective layer 14, and these strips may form column electrodes in a display device. The movable reflective layer 14 may be formed as a series of parallel strips of a deposited metal layer or layers (orthogonal to the row electrodes of the optical stack 16) to form columns deposited on top of posts 18 and an intervening sacrificial material deposited between the posts 18. When the sacrificial material is etched away, a defined gap 19, or optical cavity, can be formed between the movable reflective layer 14 and the optical stack 16. In some implementations, the spacing between posts 18 may be approximately 1-1000 um, while the gap 19 may be approximately less than 10,000 Angstroms (Å).

In some implementations, each pixel of the IMOD, whether in the actuated or relaxed state, is essentially a capacitor formed by the fixed and moving reflective layers. When no voltage is applied, the movable reflective layer 14 remains in a mechanically relaxed state, as illustrated by the pixel 12 on the left in FIG. 1, with the gap 19 between the movable reflective layer 14 and optical stack 16. However, when a potential difference, e.g., voltage, is applied to at least one of a selected row and column, the capacitor formed at the intersection of the row and column electrodes at the corresponding pixel becomes charged, and electrostatic forces pull the electrodes together. If the applied voltage exceeds a threshold, the movable reflective layer 14 can deform and move near or against the optical stack 16. A dielectric layer (not shown) within the optical stack 16 may prevent shorting and control the separation distance between the layers 14 and 16, as illustrated by the actuated pixel 12 on the right in FIG. 1. The behavior is the same regardless of the polarity of the applied potential difference. Though a series of pixels in an array may be referred to in some instances as "rows" or "columns," a person having ordinary skill in the art will readily understand that referring to one direction as a "row" and another as a "column" is arbitrary. Restated, in some orientations, the rows can be considered columns, and the columns considered to be rows. Furthermore, the display elements may be evenly arranged in orthogonal rows and columns (an "array"), or arranged in non-linear configurations, for example, having certain positional offsets with respect to one another (a "mosaic"). The terms "array" and "mosaic" may refer to either configuration. Thus, although the display is referred to as including an "array" or "mosaic," the elements themselves need not be arranged orthogonally to one another, or disposed in an even distribution, in any instance, but may include arrangements having asymmetric shapes and unevenly distributed elements.

Figure 2:
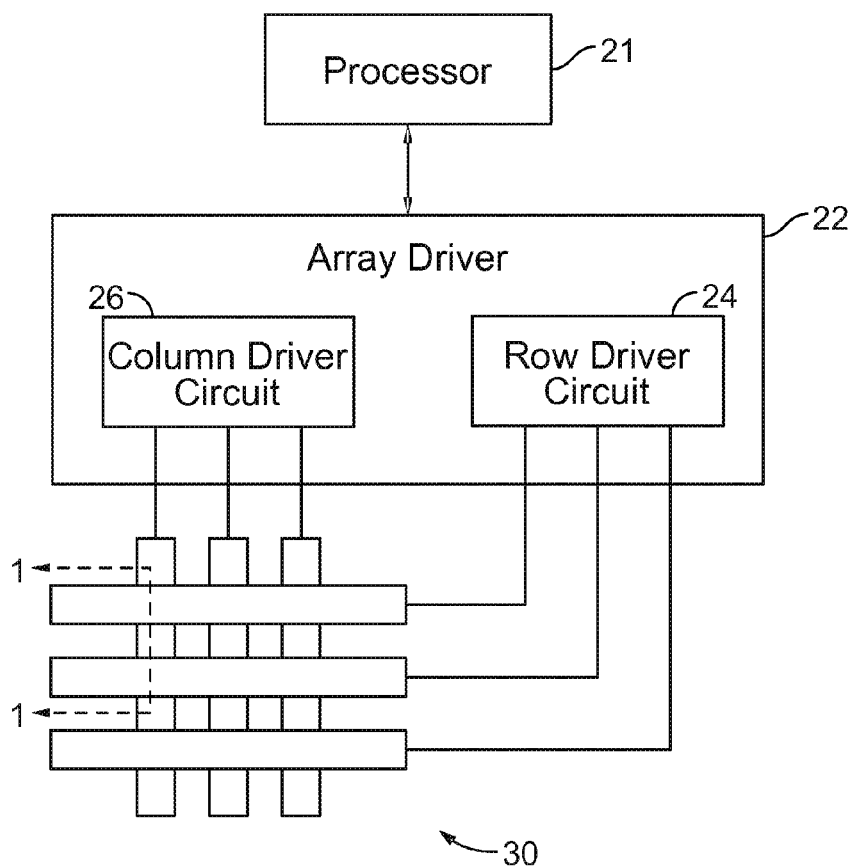
FIG. 2 shows an example of a system block diagram illustrating an electronic device incorporating a 3×3 IMOD display.

FIG. 2 shows an example of a system block diagram illustrating an electronic device incorporating a 3×3 IMOD display. The electronic device includes a processor 21 that may be configured to execute one or more software modules. In addition to executing an operating system, the processor 21 may be configured to execute one or more software applications, including a web browser, a telephone application, an email program, or any other software application.

The processor 21 can be configured to communicate with an array driver 22. The array driver 22 can include a row driver circuit 24 and a column driver circuit 26 that provide signals to, e.g., a display array or panel 30. The cross section of the IMOD display device illustrated in FIG. 1 is shown by the lines 1-1 in FIG. 2. Although FIG. 2 illustrates a 3×3 array of IMODs for the sake of clarity, the display array 30 may contain a very large number of IMODs, and may have a different number of IMODs in rows than in columns, and vice versa.

Figures 3, 4:
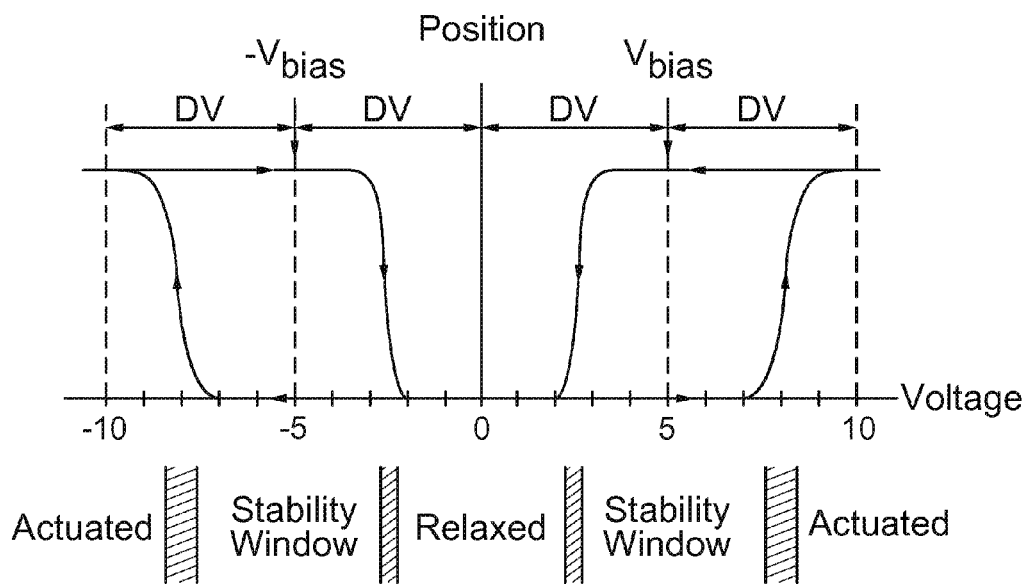
FIG. 3 shows an example of a diagram illustrating movable reflective layer position versus applied voltage for the IMOD of FIG. 1.
FIG. 4 shows an example of a table illustrating various states of an IMOD when various common and segment voltages are applied.

FIG. 3 shows an example of a diagram illustrating movable reflective layer position versus applied voltage for the IMOD of FIG. 1. For MEMS IMODs, the row/column (i.e., common/segment) write procedure may take advantage of a hysteresis property of these devices as illustrated in FIG. 3. An IMOD may use, for example, about a 10-volt potential difference to cause the movable reflective layer, or mirror, to change from the relaxed state to the actuated state. When the voltage is reduced from that value, the movable reflective layer maintains its state as the voltage drops back below, e.g., 10-volts, however, the movable reflective layer does not relax completely until the voltage drops below 2-volts. Thus, a range of voltage, approximately 3 to 7-volts, as shown in FIG. 3, exists where there is a window of applied voltage within which the device is stable in either the relaxed or actuated state. This is referred to herein as the "hysteresis window" or "stability window." For a display array 30 having the hysteresis characteristics of FIG. 3, the row/column write procedure can be designed to address one or more rows at a time, such that during the addressing of a given row, pixels in the addressed row that are to be actuated are exposed to a voltage difference of about 10-volts, and pixels that are to be relaxed are exposed to a voltage difference of near zero volts. After addressing, the pixels are exposed to a steady state or bias voltage difference of approximately 5-volts such that they remain in the previous strobing state. In this example, after being addressed, each pixel sees a potential difference within the "stability window" of about 3-7-volts. This hysteresis property feature enables the pixel design, e.g., illustrated in FIG. 1, to remain stable in either an actuated or relaxed pre-existing state under the same applied voltage conditions. Since each IMOD pixel, whether in the actuated or relaxed state, is essentially a capacitor formed by the fixed and moving reflective layers, this stable state can be held at a steady voltage within the hysteresis window without substantially consuming or losing power. Moreover, essentially little or no current flows into the IMOD pixel if the applied voltage potential remains substantially fixed.

In some implementations, a frame of an image may be created by applying data signals in the form of "segment"

voltages along the set of column electrodes, in accordance with the desired change (if any) to the state of the pixels in a given row. Each row of the array can be addressed in turn, such that the frame is written one row at a time. To write the desired data to the pixels in a first row, segment voltages corresponding to the desired state of the pixels in the first row can be applied on the column electrodes, and a first row pulse in the form of a specific "common" voltage or signal can be applied to the first row electrode. The set of segment voltages can then be changed to correspond to the desired change (if any) to the state of the pixels in the second row, and a second common voltage can be applied to the second row electrode. In some implementations, the pixels in the first row are unaffected by the change in the segment voltages applied along the column electrodes, and remain in the state they were set to during the first common voltage row pulse. This process may be repeated for the entire series of rows, or alternatively, columns, in a sequential fashion to produce the image frame. The frames can be refreshed and/or updated with new image data by continually repeating this process at some desired number of frames per second.

The combination of segment and common signals applied across each pixel (that is, the potential difference across each pixel) determines the resulting state of each pixel. FIG. 4 shows an example of a table illustrating various states of an IMOD when various common and segment voltages are applied. As will be readily understood by one having ordinary skill in the art, the "segment" voltages can be applied to either the column electrodes or the row electrodes, and the "common" voltages can be applied to the other of the column electrodes or the row electrodes.

As illustrated in FIG. 4 (as well as in the timing diagram shown in FIG. 5B), when a release voltage $VC_{REL}$ is applied along a common line, all IMOD elements along the common line will be placed in a relaxed state, alternatively referred to as a released or unactuated state, regardless of the voltage applied along the segment lines, i.e., high segment voltage $VS_H$ and low segment voltage $VS_L$. In particular, when the release voltage $VC_{REL}$ is applied along a common line, the potential voltage across the modulator (alternatively referred to as a pixel voltage) is within the relaxation window (see FIG. 3, also referred to as a release window) both when the high segment voltage $VS_H$ and the low segment voltage $VS_L$ are applied along the corresponding segment line for that pixel.

When a hold voltage is applied on a common line, such as a high hold voltage $VC_{HOLD\_H}$ or a low hold voltage $VC_{HOLD\_L}$, the state of the IMOD will remain constant. For example, a relaxed IMOD will remain in a relaxed position, and an actuated IMOD will remain in an actuated position. The hold voltages can be selected such that the pixel voltage will remain within a stability window both when the high segment voltage $VS_H$ and the low segment voltage $VS_L$ are applied along the corresponding segment line. Thus, the segment voltage swing, i.e., the difference between the high $VS_H$ and low segment voltage $VS_L$, is less than the width of either the positive or the negative stability window.

When an addressing, or actuation, voltage is applied on a common line, such as a high addressing voltage $VC_{ADD\_H}$ or a low addressing voltage $VC_{ADD\_L}$, data can be selectively written to the modulators along that line by application of segment voltages along the respective segment lines. The segment voltages may be selected such that actuation is dependent upon the segment voltage applied. When an addressing voltage is applied along a common line, application of one segment voltage will result in a pixel voltage within a stability window, causing the pixel to remain unactuated. In contrast, application of the other segment voltage will result in a pixel voltage beyond the stability window, resulting in actuation of the pixel. The particular segment voltage which causes actuation can vary depending upon which addressing voltage is used. In some implementations, when the high addressing voltage $VC_{ADD\_H}$ is applied along the common line, application of the high segment voltage $VS_H$ can cause a modulator to remain in its current position, while application of the low segment voltage $VS_L$ can cause actuation of the modulator. As a corollary, the effect of the segment voltages can be the opposite when a low addressing voltage $VC_{ADD\_L}$ is applied, with high segment voltage $VS_H$ causing actuation of the modulator, and low segment voltage $VS_L$ having no effect (i.e., remaining stable) on the state of the modulator.

In some implementations, hold voltages, address voltages, and segment voltages may be used which produce the same polarity potential difference across the modulators. In some other implementations, signals can be used which alternate the polarity of the potential difference of the modulators. Alternation of the polarity across the modulators (that is, alternation of the polarity of write procedures) may reduce or inhibit charge accumulation which could occur after repeated write operations of a single polarity.

Figure 5A:
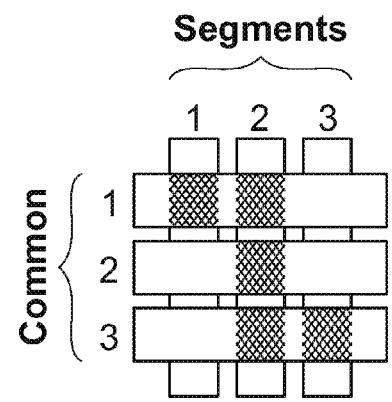
FIG. 5A shows an example of a diagram illustrating a frame of display data in the 3×3 IMOD display of FIG. 2.
Figure 5B:
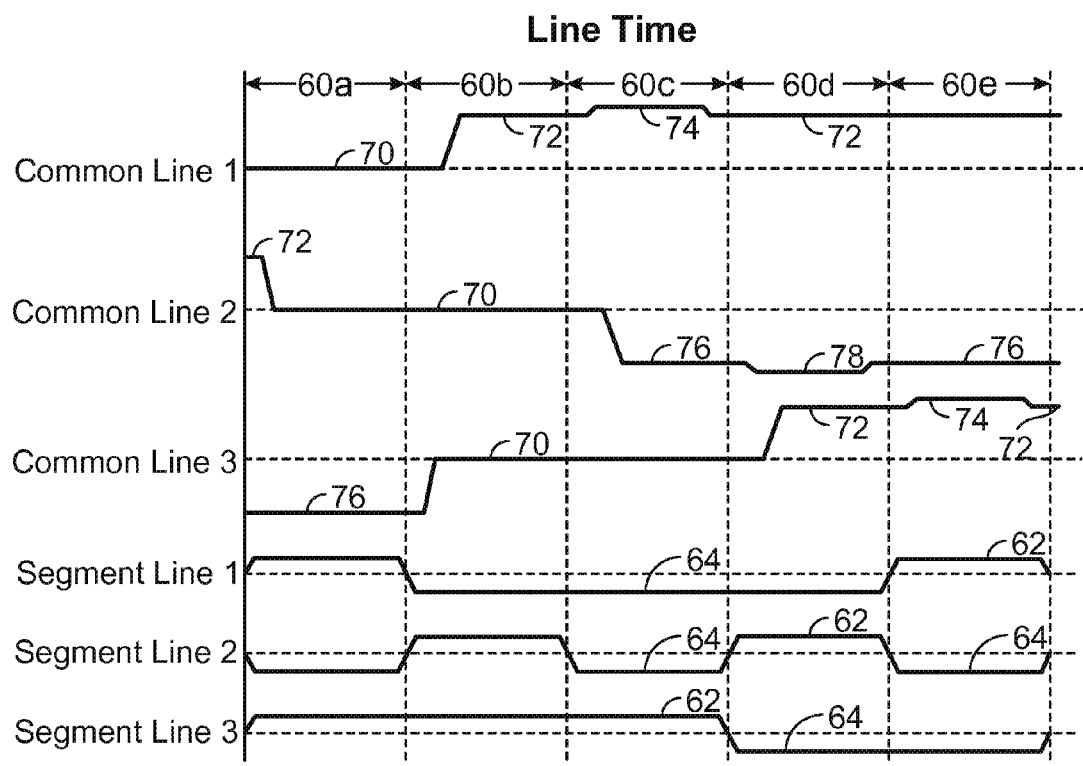
FIG. 5B shows an example of a timing diagram for common and segment signals that may be used to write the frame of display data illustrated in FIG. 5A.

FIG. 5A shows an example of a diagram illustrating a frame of display data in the 3×3 IMOD display of FIG. 2. FIG. 5B shows an example of a timing diagram for common and segment signals that may be used to write the frame of display data illustrated in FIG. 5A. The signals can be applied to the, e.g., 3×3 array of FIG. 2, which will ultimately result in the line time 60e display arrangement illustrated in FIG. 5A. The actuated modulators in FIG. 5A are in a dark-state, i.e., where a substantial portion of the reflected light is outside of the visible spectrum so as to result in a dark appearance to, e.g., a viewer. Prior to writing the frame illustrated in FIG. 5A, the pixels can be in any state, but the write procedure illustrated in the timing diagram of FIG. 5B presumes that each modulator has been released and resides in an unactuated state before the first line time 60a.

During the first line time 60a: a release voltage 70 is applied on common line 1; the voltage applied on common line 2 begins at a high hold voltage 72 and moves to a release voltage 70; and a low hold voltage 76 is applied along common line 3. Thus, the modulators (common 1, segment 1), (1,2) and (1,3) along common line 1 remain in a relaxed, or unactuated, state for the duration of the first line time 60a, the modulators (2,1), (2,2) and (2,3) along common line 2 will move to a relaxed state, and the modulators (3,1), (3,2) and (3,3) along common line 3 will remain in their previous state. With reference to FIG. 4, the segment voltages applied along segment lines 1, 2 and 3 will have no effect on the state of the IMODs, as none of common lines 1, 2 or 3 are being exposed to voltage levels causing actuation during line time 60a (i.e., $VC_{REL}$—relax and $VC_{HOLD\_L}$—stable).

During the second line time 60b, the voltage on common line 1 moves to a high hold voltage 72, and all modulators along common line 1 remain in a relaxed state regardless of the segment voltage applied because no addressing, or actuation, voltage was applied on the common line 1. The modulators along common line 2 remain in a relaxed state due to the application of the release voltage 70, and the modulators (3,1), (3,2) and (3,3) along common line 3 will relax when the voltage along common line 3 moves to a release voltage 70.

During the third line time 60c, common line 1 is addressed by applying a high address voltage 74 on common line 1. Because a low segment voltage 64 is applied along segment lines 1 and 2 during the application of this address voltage, the pixel voltage across modulators (1,1) and (1,2) is greater than the high end of the positive stability window (i.e., the voltage differential exceeded a predefined threshold) of the modulators, and the modulators (1,1) and (1,2) are actuated. Conversely, because a high segment voltage 62 is applied along segment line 3, the pixel voltage across modulator (1,3) is less than that of modulators (1,1) and (1,2), and remains within the positive stability window of the modulator; modulator (1,3) thus remains relaxed. Also during line time 60c, the voltage along common line 2 decreases to a low hold voltage 76, and the voltage along common line 3 remains at a release voltage 70, leaving the modulators along common lines 2 and 3 in a relaxed position.

During the fourth line time 60d, the voltage on common line 1 returns to a high hold voltage 72, leaving the modulators along common line 1 in their respective addressed states. The voltage on common line 2 is decreased to a low address voltage 78. Because a high segment voltage 62 is applied along segment line 2, the pixel voltage across modulator (2,2) is below the lower end of the negative stability window of the modulator, causing the modulator (2,2) to actuate. Conversely, because a low segment voltage 64 is applied along segment lines 1 and 3, the modulators (2,1) and (2,3) remain in a relaxed position. The voltage on common line 3 increases to a high hold voltage 72, leaving the modulators along common line 3 in a relaxed state.

Finally, during the fifth line time 60e, the voltage on common line 1 remains at high hold voltage 72, and the voltage on common line 2 remains at a low hold voltage 76, leaving the modulators along common lines 1 and 2 in their respective addressed states. The voltage on common line 3 increases to a high address voltage 74 to address the modulators along common line 3. As a low segment voltage 64 is applied on segment lines 2 and 3, the modulators (3,2) and (3,3) actuate, while the high segment voltage 62 applied along segment line 1 causes modulator (3,1) to remain in a relaxed position. Thus, at the end of the fifth line time 60e, the 3×3 pixel array is in the state shown in FIG. 5A, and will remain in that state as long as the hold voltages are applied along the common lines, regardless of variations in the segment voltage which may occur when modulators along other common lines (not shown) are being addressed.

In the timing diagram of FIG. 5B, a given write procedure (i.e., line times 60a-60e) can include the use of either high hold and address voltages, or low hold and address voltages. Once the write procedure has been completed for a given common line (and the common voltage is set to the hold voltage having the same polarity as the actuation voltage), the pixel voltage remains within a given stability window, and does not pass through the relaxation window until a release voltage is applied on that common line. Furthermore, as each modulator is released as part of the write procedure prior to addressing the modulator, the actuation time of a modulator, rather than the release time, may determine the necessary line time. Specifically, in implementations in which the release time of a modulator is greater than the actuation time, the release voltage may be applied for longer than a single line time, as depicted in FIG. 5B. In some other implementations, voltages applied along common lines or segment lines may vary to account for variations in the actuation and release voltages of different modulators, such as modulators of different colors.

Figure 6A:
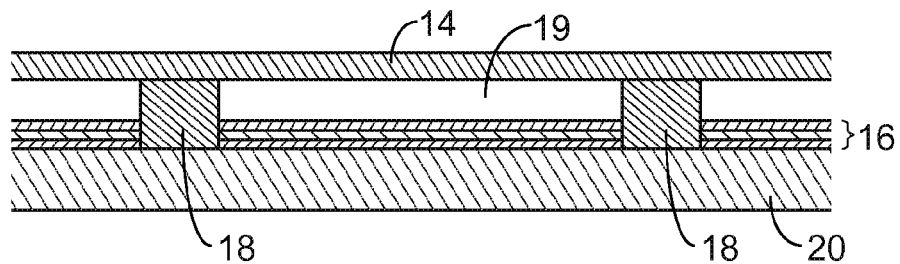
FIG. 6A shows an example of a partial cross-section of the IMOD display of FIG. 1.
Figure 6B:
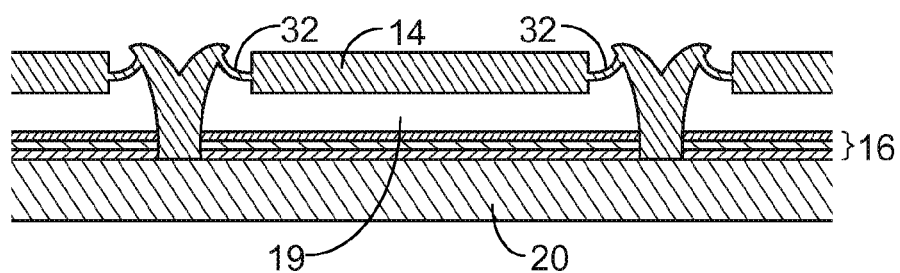
FIGS. 6B-6E show examples of cross-sections of varying implementations of IMODs.
Figure 6C:
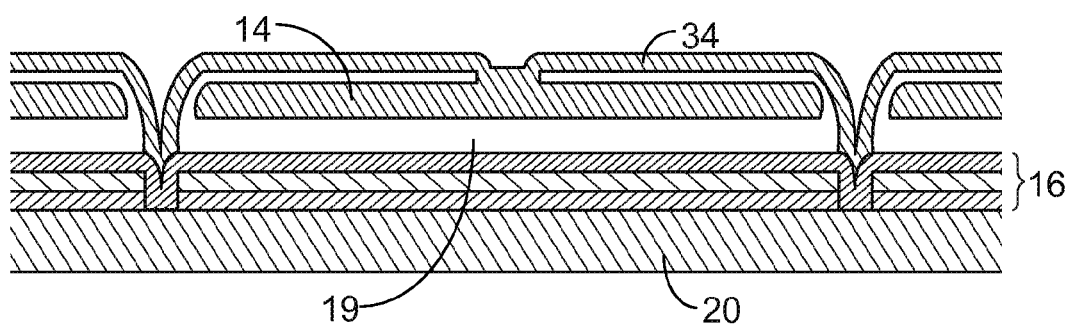

The details of the structure of IMODs that operate in accordance with the principles set forth above may vary widely. For example, FIGS. 6A-6E show examples of cross-sections of varying implementations of IMODs, including the movable reflective layer 14 and its supporting structures. FIG. 6A shows an example of a partial cross-section of the IMOD display of FIG. 1, where a strip of metal material, i.e., the movable reflective layer 14 is deposited on supports 18 extending orthogonally from the substrate 20. In FIG. 6B, the movable reflective layer 14 of each IMOD is generally square or rectangular in shape and attached to supports at or near the corners, on tethers 32. In FIG. 6C, the movable reflective layer 14 is generally square or rectangular in shape and suspended from a deformable layer 34, which may include a flexible metal. The deformable layer 34 can connect, directly or indirectly, to the substrate 20 around the perimeter of the movable reflective layer 14. These connections are herein referred to as support posts. The implementation shown in FIG. 6C has additional benefits deriving from the decoupling of the optical functions of the movable reflective layer 14 from its mechanical functions, which are carried out by the deformable layer 34. This decoupling allows the structural design and materials used for the reflective layer 14 and those used for the deformable layer 34 to be optimized independently of one another.

Figure 6D:
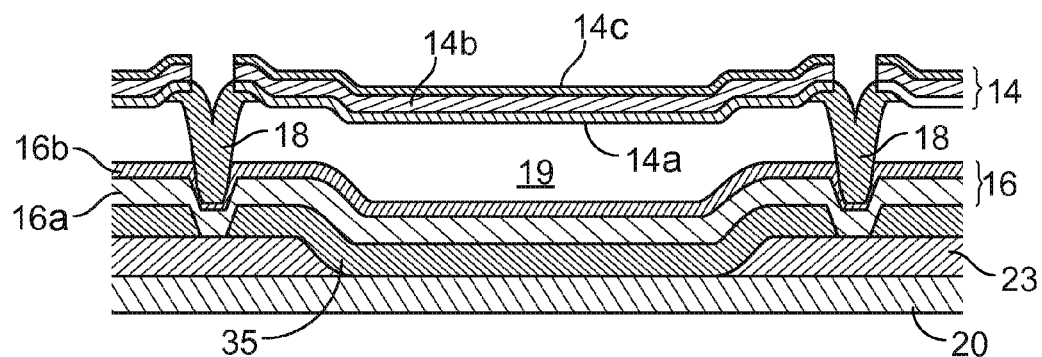

FIG. 6D shows another example of an IMOD, where the movable reflective layer 14 includes a reflective sub-layer 14a. The movable reflective layer 14 rests on a support structure, such as support posts 18. The support posts 18 provide separation of the movable reflective layer 14 from the lower stationary electrode (i.e., part of the optical stack 16 in the illustrated IMOD) so that a gap 19 is formed between the movable reflective layer 14 and the optical stack 16, for example when the movable reflective layer 14 is in a relaxed position. The movable reflective layer 14 also can include a conductive layer 14c, which may be configured to serve as an electrode, and a support layer 14b. In this example, the conductive layer 14c is disposed on one side of the support layer 14b, distal from the substrate 20, and the reflective sub-layer 14a is disposed on the other side of the support layer 14b, proximal to the substrate 20. In some implementations, the reflective sub-layer 14a can be conductive and can be disposed between the support layer 14b and the optical stack 16. The support layer 14b can include one or more layers of a dielectric material, for example, silicon oxynitride (SiON) or silicon dioxide ($SiO_2$). In some implementations, the support layer 14b can be a stack of layers, such as, for example, a $SiO_2$/SiON/$SiO_2$ tri-layer stack. Either or both of the reflective sub-layer 14a and the conductive layer 14c can include, e.g., an aluminum (Al) alloy with about 0.5% copper (Cu), or another reflective metallic material. Employing conductive layers 14a, 14c above and below the dielectric support layer 14b can balance stresses and provide enhanced conduction. In some implementations, the reflective sub-layer 14a and the conductive layer 14c can be formed of different materials for a variety of design purposes, such as achieving specific stress profiles within the movable reflective layer 14.

As illustrated in FIG. 6D, some implementations also can include a black mask structure 23. The black mask structure 23 can be formed in optically inactive regions (e.g., between pixels or under posts 18) to absorb ambient or stray light. The black mask structure 23 also can improve the optical properties of a display device by inhibiting light from being reflected from or transmitted through inactive portions of the display, thereby increasing the contrast ratio. Additionally, the black mask structure 23 can be conductive and be configured to function as an electrical bussing layer. In some implementations, the row electrodes can be connected to the black mask structure 23 to reduce the resistance of the connected row electrode. The black mask structure 23 can be formed using a variety of methods, including deposition and patterning techniques. The black mask structure 23 can include one or more layers. For example, in some implementations, the black mask structure 23 includes a molybdenum-chromium (MoCr) layer that serves as an optical absorber, a $SiO_2$ layer, and an aluminum alloy that serves as a reflector and a bussing layer, with a thickness in the range of about 30-80 Å, 500-1000 Å, and 500-6000 Å, respectively. The one or more layers can be patterned using a variety of techniques, including photolithography and dry etching, including, for example, carbon tetrafluoride ($CF_4$) and/or oxygen ($O_2$) for the MoCr and $SiO_2$ layers and chlorine ($Cl_2$) and/or boron trichloride ($BCl_3$) for the aluminum alloy layer. In some implementations, the black mask 23 can be an etalon or interferometric stack structure. In such interferometric stack black mask structures 23, the conductive absorbers can be used to transmit or bus signals between lower, stationary electrodes in the optical stack 16 of each row or column. In some implementations, a spacer layer 35 can serve to generally electrically isolate the absorber layer 16a from the conductive layers in the black mask 23.

Figure 6E:
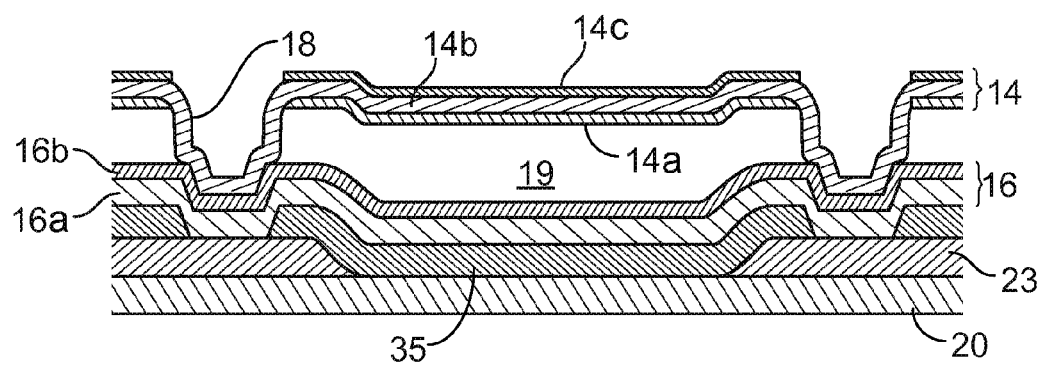

FIG. 6E shows another example of an IMOD, where the movable reflective layer 14 is self-supporting. In contrast with FIG. 6D, the implementation of FIG. 6E does not include support posts 18. Instead, the movable reflective layer 14 contacts the underlying optical stack 16 at multiple locations, and the curvature of the movable reflective layer 14 provides sufficient support that the movable reflective layer 14 returns to the unactuated position of FIG. 6E when the voltage across the IMOD is insufficient to cause actuation. The optical stack 16, which may contain a plurality of several different layers, is shown here for clarity including an optical absorber 16a, and a dielectric 16b. In some implementations, the optical absorber 16a may serve both as a fixed electrode and as a partially reflective layer.

In implementations such as those shown in FIGS. 6A-6E, the IMODs function as direct-view devices, in which images are viewed from the front side of the transparent substrate 20, i.e., the side opposite to that upon which the modulator is arranged. In these implementations, the back portions of the device (that is, any portion of the display device behind the movable reflective layer 14, including, for example, the deformable layer 34 illustrated in FIG. 6C) can be configured and operated upon without impacting or negatively affecting the image quality of the display device, because the reflective layer 14 optically shields those portions of the device. For example, in some implementations a bus structure (not illustrated) can be included behind the movable reflective layer 14 which provides the ability to separate the optical properties of the modulator from the electromechanical properties of the modulator, such as voltage addressing and the movements that result from such addressing. Additionally, the implementations of FIGS. 6A-6E can simplify processing, such as patterning.

Figure 7:
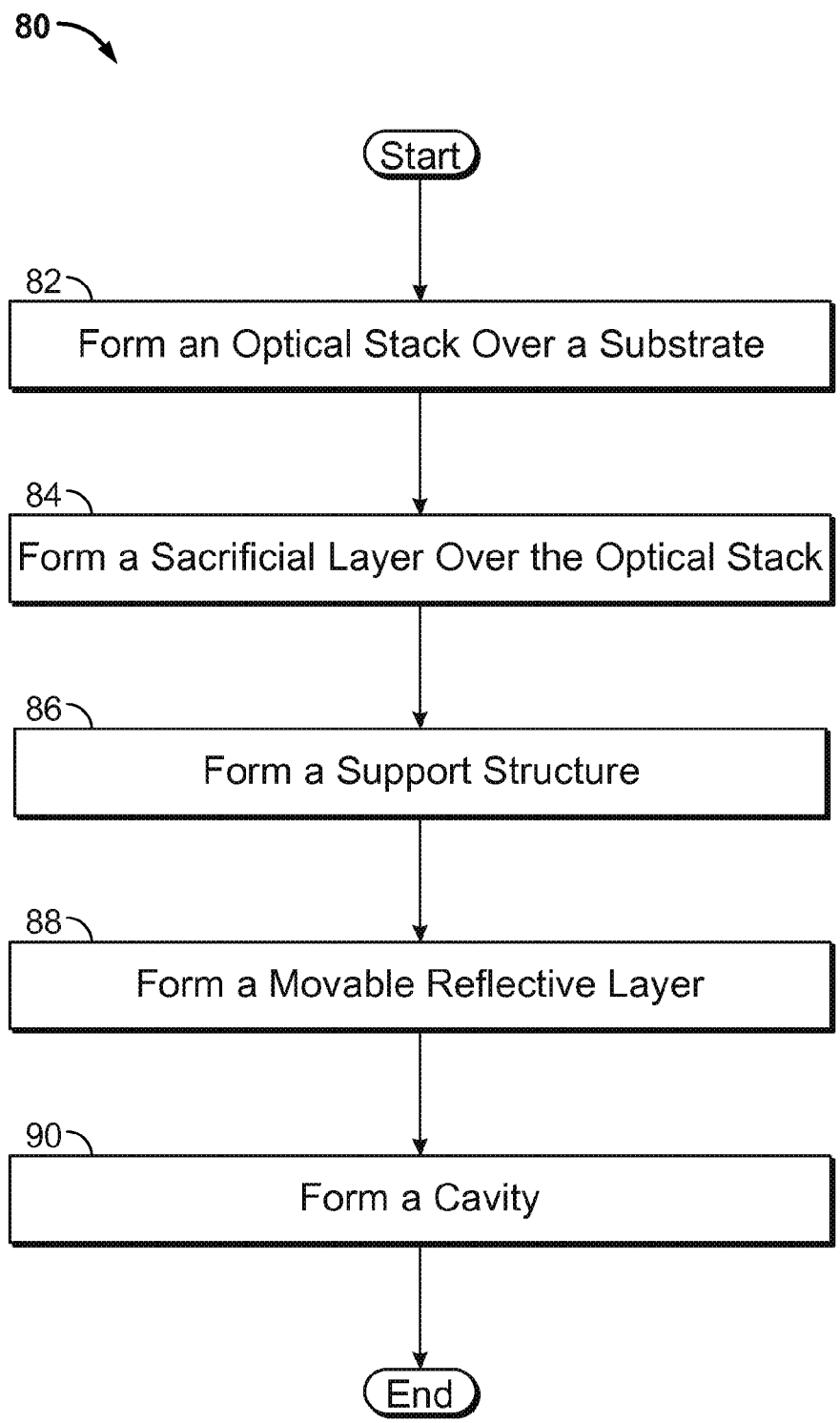
FIG. 7 shows an example of a flow diagram illustrating a manufacturing process for an IMOD.
Figure 8A:
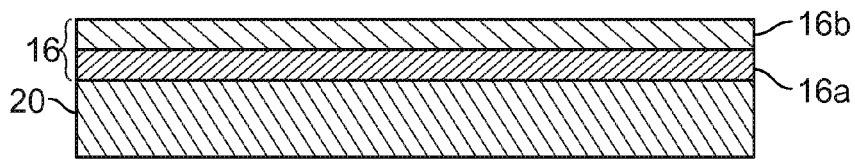
FIGS. 8A-8E show examples of cross-sectional schematic illustrations of various stages in a method of making an IMOD.

FIG. 7 shows an example of a flow diagram illustrating a manufacturing process 80 for an IMOD, and FIGS. 8A-8E show examples of cross-sectional schematic illustrations of corresponding stages of such a manufacturing process 80. In some implementations, the manufacturing process 80 can be implemented to manufacture, e.g., IMODs of the general type illustrated in FIGS. 1 and 6, in addition to other blocks not shown in FIG. 7. With reference to FIGS. 1, 6 and 7, the process 80 begins at block 82 with the formation of the optical stack 16 over the substrate 20. FIG. 8A illustrates such an optical stack 16 formed over the substrate 20. The substrate 20 may be a transparent substrate such as glass or plastic, it may be flexible or relatively stiff and unbending, and may have been subjected to prior preparation processes, e.g., cleaning, to facilitate efficient formation of the optical stack 16. As discussed above, the optical stack 16 can be electrically conductive, partially transparent and partially reflective and may be fabricated, for example, by depositing one or more layers having the desired properties onto the transparent substrate 20. In FIG. 8A, the optical stack 16 includes a multilayer structure having sub-layers 16a and 16b, although more or fewer sub-layers may be included in some other implementations. In some implementations, one of the sub-layers 16a, 16b can be configured with both optically absorptive and conductive properties, such as the combined conductor/absorber sub-layer 16a. Additionally, one or more of the sub-layers 16a, 16b can be patterned into parallel strips, and may form row electrodes in a display device. Such patterning can be performed by a masking and etching process or another suitable process known in the art. In some implementations, one of the sub-layers 16a, 16b can be an insulating or dielectric layer, such as sub-layer 16b that is deposited over one or more metal layers (e.g., one or more reflective and/or conductive layers). In addition, the optical stack 16 can be patterned into individual and parallel strips that form the rows of the display.

Figure 8B:
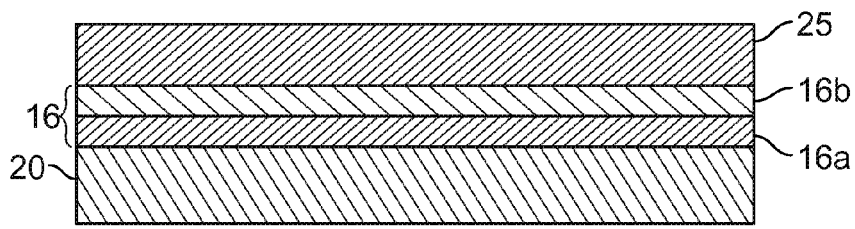

The process 80 continues at block 84 with the formation of a sacrificial layer 25 over the optical stack 16. The sacrificial layer 25 is later removed (e.g., at block 90) to form the cavity 19 and thus the sacrificial layer 25 is not shown in the resulting IMODs 12 illustrated in FIG. 1. FIG. 8B illustrates a partially fabricated device including a sacrificial layer 25 formed over the optical stack 16. The formation of the sacrificial layer 25 over the optical stack 16 may include deposition of a xenon difluoride ($XeF_2$)-etchable material such as molybdenum (Mo) or amorphous silicon (Si), in a thickness selected to provide, after subsequent removal, a gap or cavity 19 (see also FIGS. 1 and 8E) having a desired design size. Deposition of the sacrificial material may be carried out using deposition techniques such as physical vapor deposition (PVD, e.g., sputtering), plasma-enhanced chemical vapor deposition (PECVD), thermal chemical vapor deposition (thermal CVD), or spin-coating.

Figure 8C:
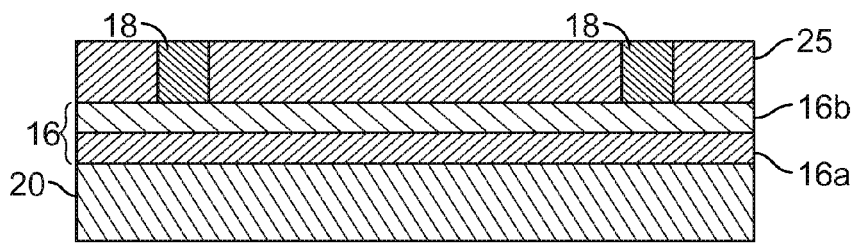

The process 80 continues at block 86 with the formation of a support structure e.g., a post 18 as illustrated in FIGS. 1, 6 and 8C. The formation of the post 18 may include patterning the sacrificial layer 25 to form a support structure aperture, then depositing a material (e.g., a polymer or an inorganic material, e.g., silicon oxide) into the aperture to form the post 18, using a deposition method such as PVD, PECVD, thermal CVD, or spin-coating. In some implementations, the support structure aperture formed in the sacrificial layer can extend through both the sacrificial layer 25 and the optical stack 16 to the underlying substrate 20, so that the lower end of the post 18 contacts the substrate 20 as illustrated in FIG. 6A. Alternatively, as depicted in FIG. 8C, the aperture formed in the sacrificial layer 25 can extend through the sacrificial layer 25, but not through the optical stack 16. For example, FIG. 8E illustrates the lower ends of the support posts 18 in contact with an upper surface of the optical stack 16. The post 18, or other support structures, may be formed by depositing a layer of support structure material over the sacrificial layer 25 and patterning portions of the support structure material located away from apertures in the sacrificial layer 25. The support structures may be located within the apertures, as illustrated in FIG. 8C, but also can, at least partially, extend over a portion of the sacrificial layer 25. As noted above, the patterning of the sacrificial layer 25 and/or the support posts 18 can be performed by a patterning and etching process, but also may be performed by alternative etching methods.

Figure 8D:
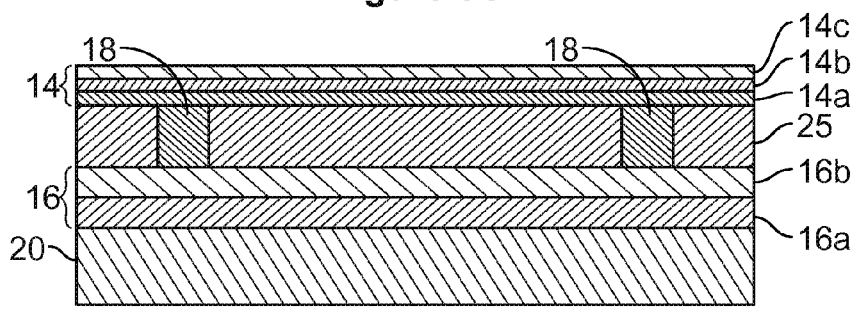
Figure 8E:
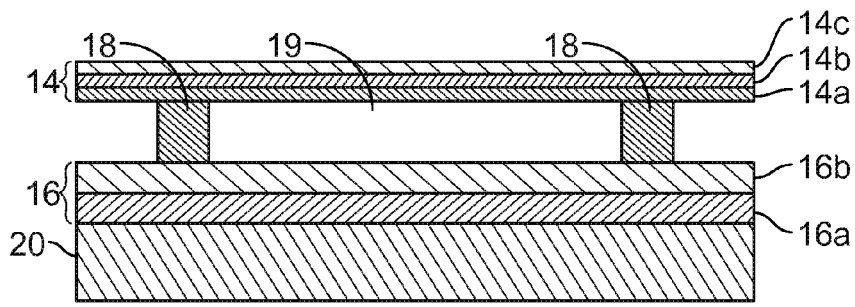

The process 80 continues at block 88 with the formation of a movable reflective layer or membrane such as the movable reflective layer 14 illustrated in FIGS. 1, 6 and 8D. The movable reflective layer 14 may be formed by employing one or more deposition steps, e.g., reflective layer (e.g., aluminum, aluminum alloy) deposition, along with one or more patterning, masking, and/or etching steps. The movable reflective layer 14 can be electrically conductive, and referred to as an electrically conductive layer. In some implementations, the movable reflective layer 14 may include a plurality of sub-layers 14a, 14b, 14c as shown in FIG. 8D. In some implementations, one or more of the sub-layers, such as sub-layers 14a, 14c, may include highly reflective sub-layers selected for their optical properties, and another sub-layer 14b may include a mechanical sub-layer selected for its mechanical properties. Since the sacrificial layer 25 is still present in the partially fabricated IMOD formed at block 88, the movable reflective layer 14 is typically not movable at this stage. A partially fabricated IMOD that contains a sacrificial layer 25 also may be referred to herein as an "unreleased" IMOD. As described above in connection with FIG. 1, the movable reflective layer 14 can be patterned into individual and parallel strips that form the columns of the display.

The process 80 continues at block 90 with the formation of a cavity, e.g., cavity 19 as illustrated in FIGS. 1, 6 and 8E. The cavity 19 may be formed by exposing the sacrificial material 25 (deposited at block 84) to an etchant. For example, an etchable sacrificial material such as Mo or amorphous Si may be removed by dry chemical etching, e.g., by exposing the sacrificial layer 25 to a gaseous or vaporous etchant, such as vapors derived from solid $XeF_2$ for a period of time that is effective to remove the desired amount of material, typically selectively removed relative to the structures surrounding the cavity 19. Other etching methods, such as wet etching and/or plasma etching, also may be used. Since the sacrificial layer 25 is removed during block 90, the movable reflective layer 14 is typically movable after this stage. After removal of the sacrificial material 25, the resulting fully or partially fabricated IMOD may be referred to herein as a "released" IMOD.

Another example of an EMS device is a microspeaker. In some implementations, one, two, or multiple microspeakers may be mounted, joined or otherwise connected to one or more EMS devices, such as an IMOD display device. In some implementations, one, two, or multiple microspeakers may be fabricated as part of an IMOD display device.

Figure 9A:
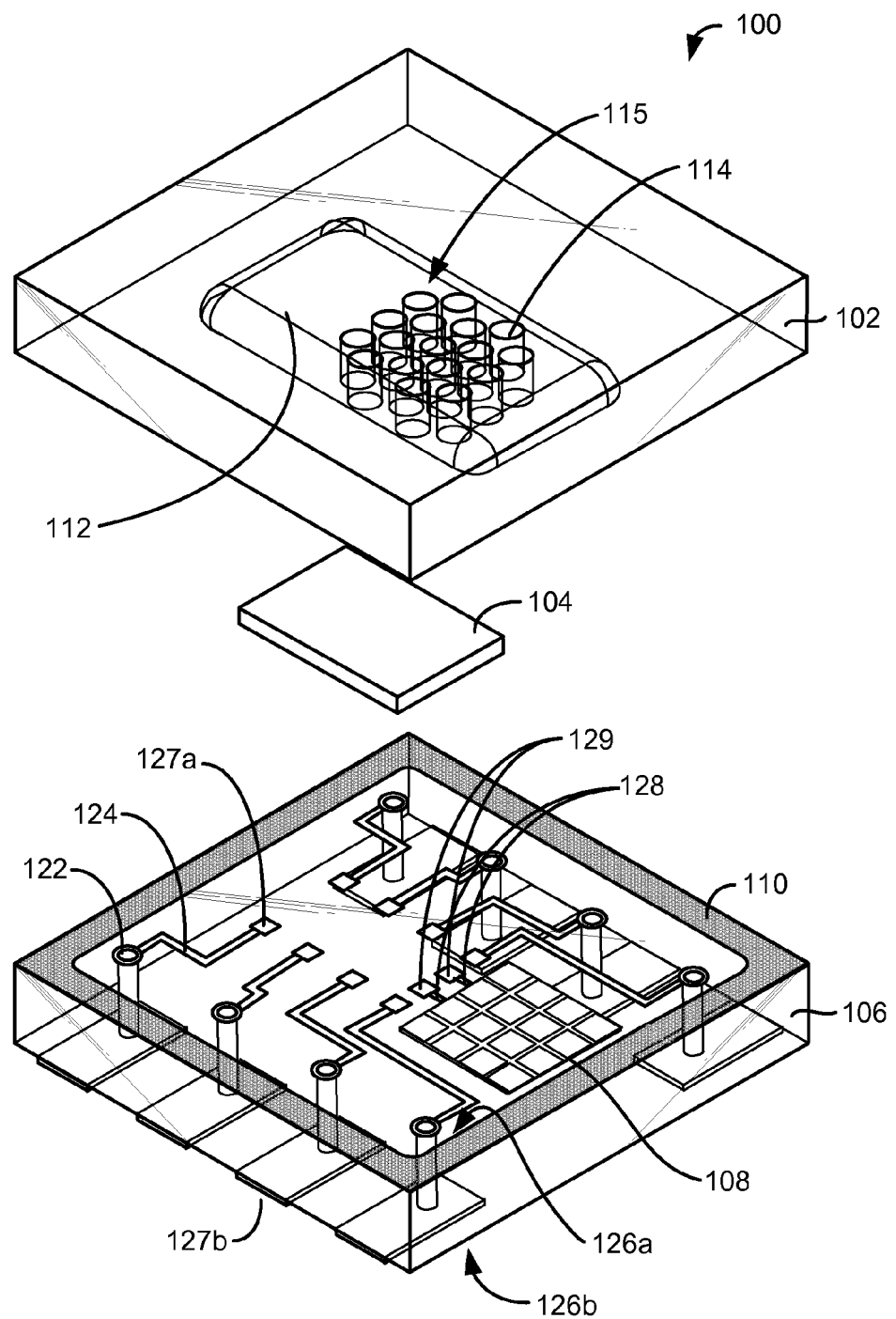
FIGS. 9A-10B show examples of a glass-encapsulated microspeaker including a microspeaker array on a glass substrate with a cover glass.
Figure 9B:
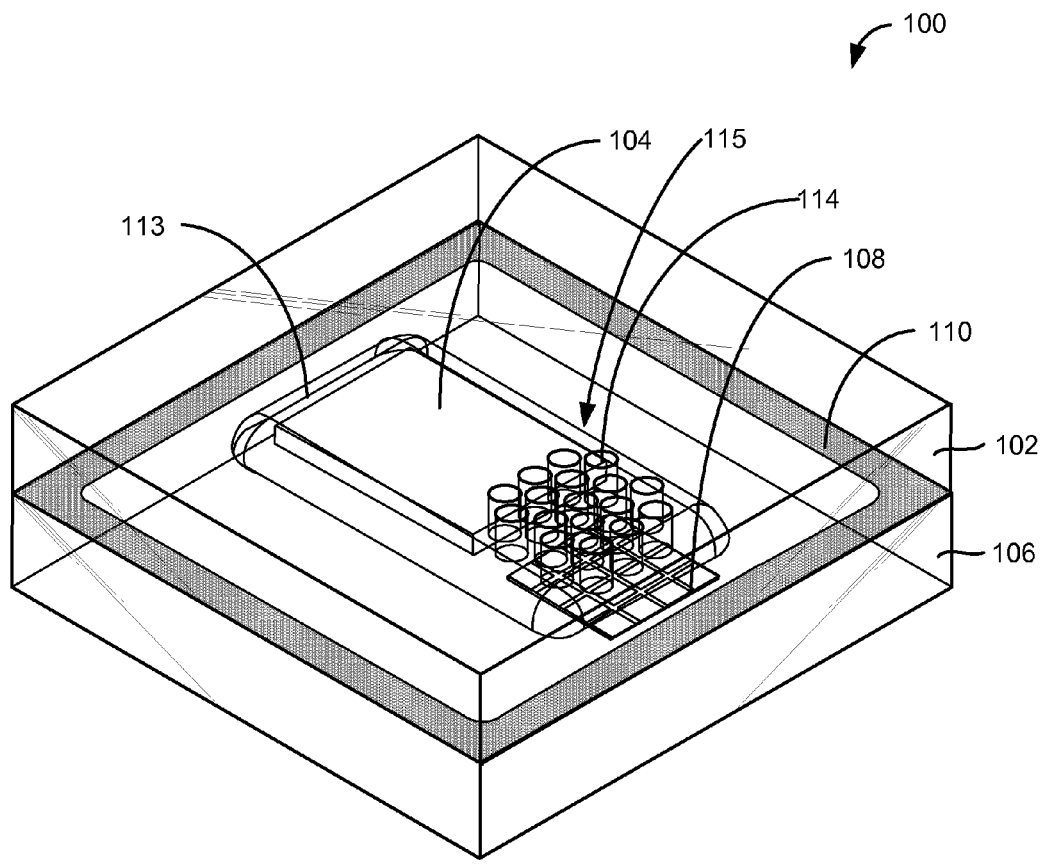

FIGS. 9A and 9B show examples of a glass-encapsulated microspeaker including a microspeaker array on a glass substrate with a cover glass. FIG. 9A shows an example of an exploded view diagram of the glass-encapsulated microspeaker. FIG. 9B shows an example of a simplified isometric view of the glass-encapsulated microspeaker shown in FIG. 9A. For clarity, some components shown in FIG. 9A are not shown in FIG. 9B.

The glass-encapsulated microspeaker 100 shown in the example of FIGS. 9A and 9B includes a cover glass 102, an integrated circuit device 104, a glass substrate 106, a microspeaker array 108, and a joining ring 110. While the cover glass 102 and the glass substrate 106 are depicted as transparent in the FIGS. 9A and 9B, as well as some other Figures, the cover glass and the glass substrate may be transparent or non-transparent. For example, the cover glass and the glass substrate may be frosted, coated, painted, or otherwise made opaque.

A cover glass can be a planar substrate having two major substantially parallel surfaces and one or more recesses. The cover glass 102 includes a recess 112 as shown in FIG. 9A. When the cover glass 102 is bonded to the glass substrate 106, a cavity 113 is formed as shown in FIG. 9B. The cavity 113 is a volume that may accommodate different components of the glass-encapsulated microspeaker 100. The cavity 113 in the example of FIGS. 9A and 9B accommodates the integrated circuit device 104 and the microspeaker array 108.

In some implementations, the length and the width of the cover glass 102 may be the same or approximately the same as the length and the width of the glass substrate 106. For example, a length of the cover glass may be about 1 to 5 mm, and a width of the cover glass may be about 1 to 5 mm. In some implementations, the cover glass and the glass substrate may have approximately the same dimensions and may be rectangular or square. In some implementations, the cover glass and the glass substrate may have approximately the same dimensions and may be circular, an oval, or another shape. In various implementations, the cover glass can be about 50 to 700 microns thick, for example, about 100 to 300 microns thick, about 300 to 500 microns thick, or about 500 microns thick.

The integrated circuit device 104 can be configured to provide input to the microspeaker array 108 and can be disposed on the glass substrate 106. In some implementations, the integrated circuit device 104 may be an application-specific integrated circuit (ASIC). In the example of FIGS. 9A and 9B, the integrated circuit device 104 is flip-chip bonded to topside bond pads 127a on the glass substrate 106. In some implementations, the integrated circuit device 104 may be wire-bonded to bond pads or fabricated on the surface of the glass substrate 106.

The glass substrate 106 is generally a planar substrate having two substantially parallel surfaces, a top surface 126a and a bottom surface 126b. Through-glass vias 122 provide conductive pathways between portions of the top surface 126a and the bottom surface 126b through the glass substrate 106. Conductive topside traces 124 on the top surface 126a connect the through-glass vias 122 to the topside bond pads 127a, which provide electrical connections to the integrated circuit device 104. Bottomside bond pads 127b on the bottom surface 126b provide bottomside electrical connections to the through-glass vias 122. The microspeaker array 108 and the integrated circuit device 104 may be electrically connected to one or more of the through-glass vias 122 directly or indirectly by the conductive topside traces 124 on the glass substrate 106. In the example shown, conductive topside traces 128 connect the microspeaker array 108 to bond pads 129; the bond pads 129 may be used for connections to the integrated circuit device 104. The through-glass vias 122 thus provide direct electrical connection from one or more traces, bond pads, integrated circuit devices, microspeaker elements, and/or other components on one side of the glass substrate 106 to one or more traces, bond pads, and/or other components on the opposing side. The particular arrangement of the through-glass vias 122, the conductive topside traces 124, and the topside and bottomside bond pads 127a and 127b associated with the glass substrate 106 are an example of one possible arrangement, with other arrangements possible according to the desired implementation.

In the example shown in FIGS. 9A and 9B, the joining ring 110 surrounds the through-glass vias 122, the conductive topside traces 124, and the topside bond pads 127a. In some implementations, the joining ring 110 may overlay some of the conductive topside traces 124 and/or some of the through-glass vias 122. Further description of glass substrates and electrically conductive through-glass vias may be found in U.S. patent application Ser. No. 13/048,768, entitled "THIN FILM THROUGH-GLASS VIA AND METHODS FOR FORMING SAME," filed Mar. 15, 2011, and in U.S. patent application Ser. No. 13/221,677, entitled DIE-CUT THROUGH-GLASS VIA AND METHODS FOR FORMING SAME," filed Aug. 30, 2011, which are hereby incorporated by reference.

In some implementations, portions of the conductive topside traces 124 on the top surface 126a that are exposed to the outside environment may be passivated. For example, the conductive topside traces may be passivated with a passivation layer, such as a coating of an oxide or a nitride. The passivation layer may prevent the conductive topside traces from becoming oxidized and possibly causing failure of the glass-encapsulated microspeaker 100. The passivation layer may be deposited with a CVD process or PVD process, or other appropriate deposition technique. Further, other exposed metal surfaces of the glass-encapsulated microspeaker 100 also may be passivated.

In some implementations, a length of the glass substrate 106 may be about 1 to 5 mm, and a width of the glass substrate 106 may be about 1 to 5 mm. In various implementations, the glass substrate 106 can be about 50 to 700 microns thick, for example, about 100 to 300 microns thick, about 300 to 500 microns thick, or about 500 microns thick.

The joining ring 110 bonds the cover glass 102 to the glass substrate 106. The joining ring 110 may be shaped in any appropriate manner and is generally shaped and sized to correspond to the cover glass 102 and the glass substrate 106 to be joined. The joining ring 110 may include any number of different bonding materials. In some implementations, the joining ring 110 may be an adhesive. For example, the joining ring 110 may be an epoxy, including an ultraviolet (UV) curable epoxy or a heat-curable epoxy. In some implementations, the joining ring 110 may be a glass frit bond ring. In some implementations, the joining ring 110 may be a metal bond ring. The metal bond ring may include a solderable metallurgy, a eutectic metallurgy, a solder paste, or the like. Examples of solderable metallurgies include nickel/gold (Ni/Au), nickel/palladium (Ni/Pd), nickel/palladium/gold (Ni/Pd/Au), copper (Cu), and gold (Au). Eutectic metal bonding involves forming a eutectic alloy layer between the cover glass 102 and the glass substrate 106. Examples of eutectic alloys that may be used include indium/bismuth (InBi), copper/tin (CuSn), and gold/tin (AuSn). Melting temperatures of these eutectic alloys are about 150° C. for the InBi eutectic alloy, about 225° C. for the CuSn eutectic alloy, and about 305° C. for the AuSn eutectic alloy.

The microspeaker array 108 may be formed on or attached to the glass substrate 106. The microspeaker array 108 may include any number of individual microspeaker elements. For example, the microspeaker array 108 can include a 1×1, 1×2, 2×2, 10×10, or 10×20 array of individual microspeaker elements. In some implementations, each microspeaker element includes a deformable dielectric membrane that deflects on receiving a driving signal, for example, from the integrated circuit device 104. Further details of implementations of the microspeaker elements are described below with respect to FIGS. 12A-17. The deformed membrane generates sound waves that are emitted through a speaker grill 115 in the cover glass 102. The speaker grill 115 includes multiple acoustic ports 114 extending through the cover glass 102, through which sound waves can be transmitted to, e.g., a user. In some implementations, the deformed membrane can generate sound having a frequency between about 20 Hz and 20,000 Hz, or a portion thereof. In some implementations, the microspeaker or microspeaker array can be sized and driven to generate ultrasonic sound waves up to 40,000 Hz and higher.

The speaker grill 115 allows sound waves to pass from the microspeaker array 108 while still allowing the cover glass 102 to protect the internal components of the glass-encapsulated microspeaker 100. The acoustic ports 114 in the speaker grill 115 may be in a number of different configurations, including a single hole or multiple holes arranged in a hexagonal, circular, or square array, for example. The acoustic ports 114 also may be in any of a number of different shapes, including circular, rectangular, or triangular shapes, for example. In some implementations, the acoustic ports 114 are designed such that they do not act as an acoustic cutoff for a sound wave in the frequency range to be emitted by the glass-encapsulated microspeaker 100. For example, the diameter of each of the acoustic ports 114 may be large enough and the depth of each of the acoustic ports 114 may be thin enough to allow moderately low, medium, and high frequency sound to pass while rolling off sound waves at low frequencies. Example diameters of the holes range from about 10 to 30 microns on the low side to over 500 microns on the high side. In some implementations, the acoustic ports 114 can be coated with a hydrophobic material. Examples of hydrophobic coatings include polytetrafluoroethylene and other fluoropolymers.

Figure 10A:
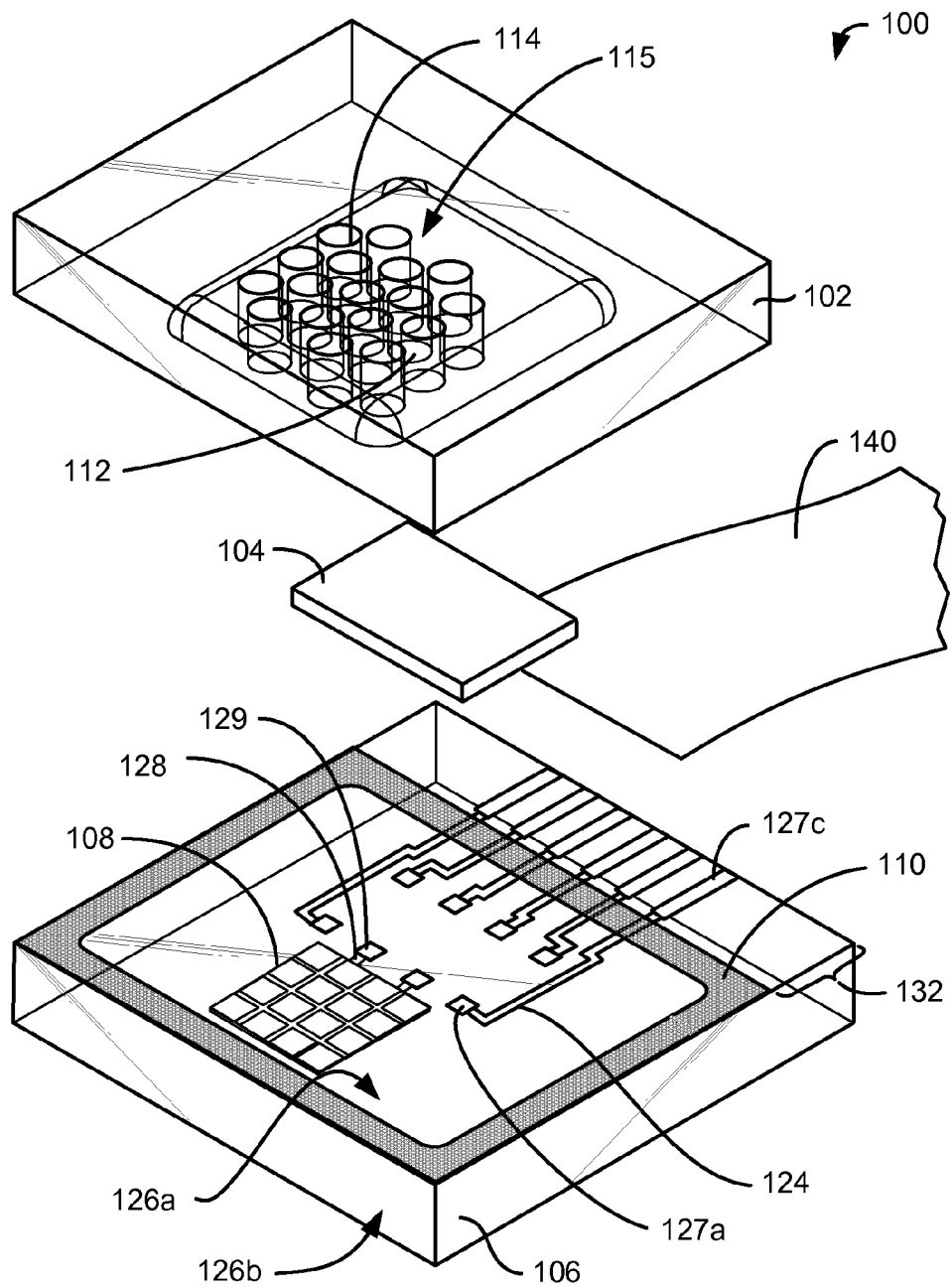
Figure 10B:
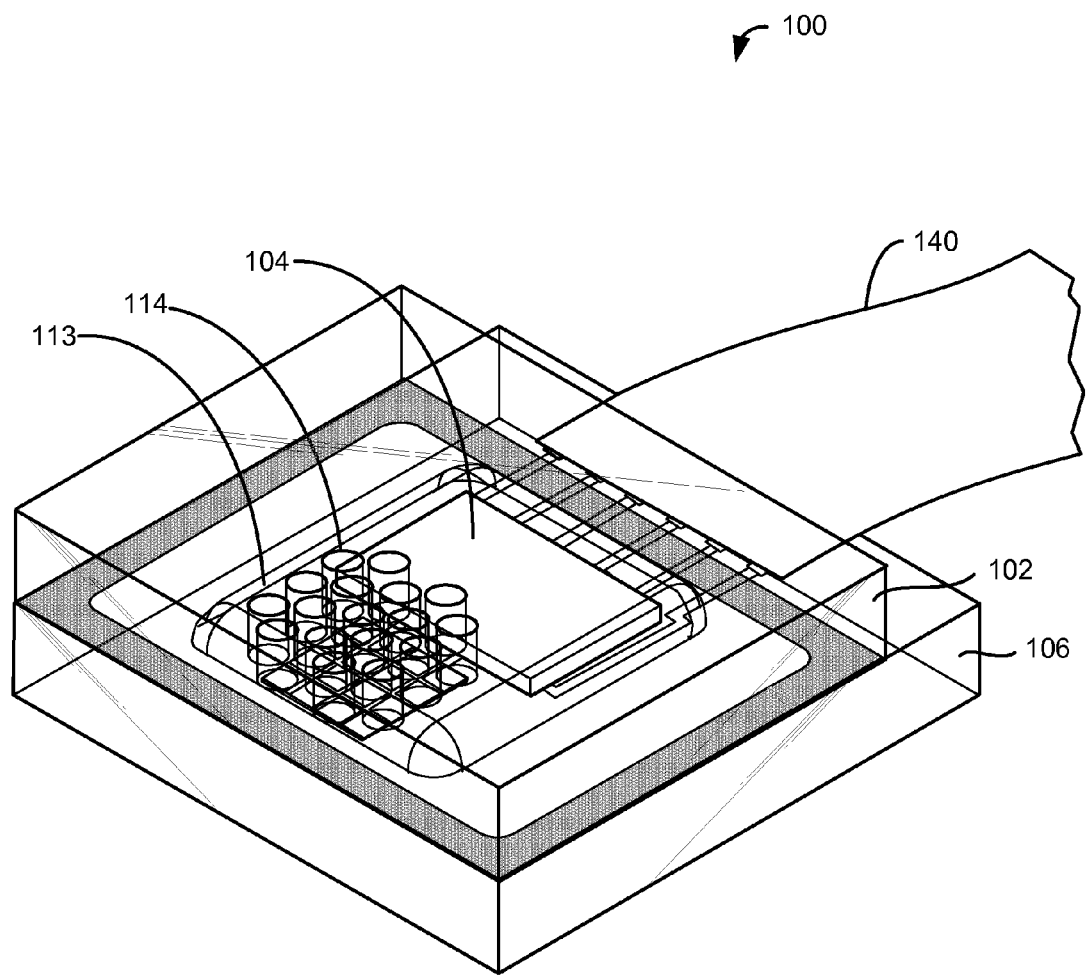

FIGS. 10A and 10B show another example of a glass-encapsulated microspeaker including a microspeaker array on a glass substrate with a cover glass. FIG. 10A shows an example of an exploded view diagram of the glass-encapsulated microspeaker. FIG. 10B shows an example of an isometric view of the glass-encapsulated microspeaker shown in FIG. 10A.

The glass-encapsulated microspeaker 100 shown in FIGS. 10A and 10B includes a cover glass 102, an integrated circuit device 104, a glass substrate 106, a microspeaker array 108, and a joining ring 110. The cover glass 102 includes a recess 112 and a speaker grill 115 including through-glass acoustic ports 114. When the cover glass 102 is bonded to the glass substrate 106, a cavity 113 is formed by the recess 112.

The glass substrate 106 is a substantially planar substrate having two substantially parallel surfaces, a top surface 126a and a bottom surface 126b. A ledge 132 allows for electrical connections to portions of the top surface 126a enclosed by the cover glass 102. Conductive topside traces 124 on the top surface 126a connect topside bond pads 127a to ledge pads 127c. The topside bond pads 127a may be used for connections to the integrated circuit device 104. The microspeaker array 108 and the integrated circuit device 104 may be electrically connected to one or more of the ledge pads 127c directly or indirectly by the conductive topside traces 124 on the glass substrate 106. In the example shown, conductive topside traces 128 connect the microspeaker array 108 to bond pads 129, with the bond pads 129 connecting the microspeaker array 108 to the integrated circuit device 104. The conductive topside traces 124 and 128 thus provide electrical connection from one or more bond pads 127a and 129, integrated circuit device 104, microspeaker array 108, or other components that may be enclosed by the cover glass 102, to one or more ledge pads 127c or other components. The particular arrangement of the conductive traces, the bond pads, and the ledge pads associated with the glass substrate 106 are an example of one possible arrangement, with other arrangements possible according to the desired implementation.

In some implementations, portions of the conductive topside traces 124 and/or 128 on the top surface 126a that are exposed to the outside environment may be passivated. For example, the conductive topside traces 124 and/or 128 may be passivated with a passivation layer, such as a coating of an oxide or a nitride.

The joining ring 110 bonds the cover glass 102 to the glass substrate 106. The joining ring 110 may include any number of different bonding materials, as described above with respect to FIGS. 9A and 9B. In some implementations, when the joining ring 110 is a metal bond ring bonding the cover glass 102 to the glass substrate 106, the conductive topside traces 124 electrically connecting the topside bond pads 127a to the ledge pads 127c may be electrically insulated from the metal bond ring. For example, the conductive topside traces 124 may be electrically insulated by a passivation layer, as described above.

The glass-encapsulated microspeaker 100 shown in FIGS. 10A and 10B may further include a flexible connector 140, also referred to as a ribbon cable, a flexible flat cable, or a flex tape. The flexible connector 140 may include a polymer film with embedded electrical connections, such as conducting wires or traces, running parallel to each other on the same flat plane. The flexible connector 140 also may include flex pads at one end and contacts at the other end, with the conducting wires or traces electrically connecting individual flex pads with individual contacts. The flex pads may be on the bottom surface of the flexible connector 140, and are not shown in FIG. 10A or 10B. The flex pads may be configured to make contact with the ledge pads 127c. In some implementations, the flex pads of the flexible connector 140 may be bonded to the ledge pads 127c of the glass-encapsulated microspeaker 100 with an anisotropic conductive film (ACF). In some implementations, the flex pads of the flexible connector 140 may be bonded to the ledge pads 127c of the glass-encapsulated microspeaker 100 with solder. The contacts of the flexible connector 140 may be assembled in a socket or other connector, for example, for connection to a printed circuit board (PCB) or other electronic component.

In some implementations, the glass-encapsulated microspeaker 100 with a ledge 132 for connection to a flexible connector 140 may allow the glass-encapsulated microspeaker 100 to be located away from a PCB or other electronic component. When the glass-encapsulated microspeaker 100 is located away from a PCB or other electronic component, the PCB may be enclosed within a water resistant enclosure, improving the reliability of the electronic device incorporating the glass-encapsulated microspeaker and the PCB. Further, the flexible connector 140 may allow the glass-encapsulated microspeaker 100 to be mounted near where sound generation is desired, such as in in-ear headphones or at the periphery of a mobile device, such as a cell phone. For example, the glass-encapsulated microspeaker 100 can be located in an in-ear headphone of a user, with some or all of the associated control electronics in an IC device located outside the ear. The use of a flexible connector also may obviate a need for electrical vias through the glass substrate, which may simplify the fabrication processes for the glass-encapsulated microspeaker 100.

Various modifications to the examples of glass-encapsulated microspeakers described in reference to FIGS. 9A-10B may be made. In some implementations, for example, a cover glass of a glass encapsulated microspeaker can include two recesses such that when the cover glass is bonded to the glass substrate, two cavities are formed. In some implementations, one of these two cavities can accommodate an integrated circuit device, with the other accommodating a microspeaker array. In some implementations, a joining ring can separate an integrated circuit device from a microspeaker array. In some implementations, a glass-encapsulated microspeaker may not include an integrated circuit device disposed between a cover glass and glass substrate. In some implementations, the microspeaker array can be driven by an external integrated circuit device mounted on a flexible connector or PCB, for example. In some implementations, components such as through-glass vias, conductive traces, and pads may be included on or through a cover glass, instead or in addition to such components on or through a glass substrate. In some implementations, the glass-encapsulated microspeaker can include a large side port in the cover glass instead of a speaker grill. Further features of glass packages that may be implemented with the glass-encapsulated microspeakers described herein are given in co-pending U.S. patent application Ser. Nos. 13/221,701, 13/221,717, and 13/221,744, each entitled "GLASS AS A SUBSTRATE MATERIAL AND A FINAL PACKAGE FOR MEMS AND IC DEVICES" and filed Aug. 30, 2011, which are hereby incorporated by reference.

Figure 11:
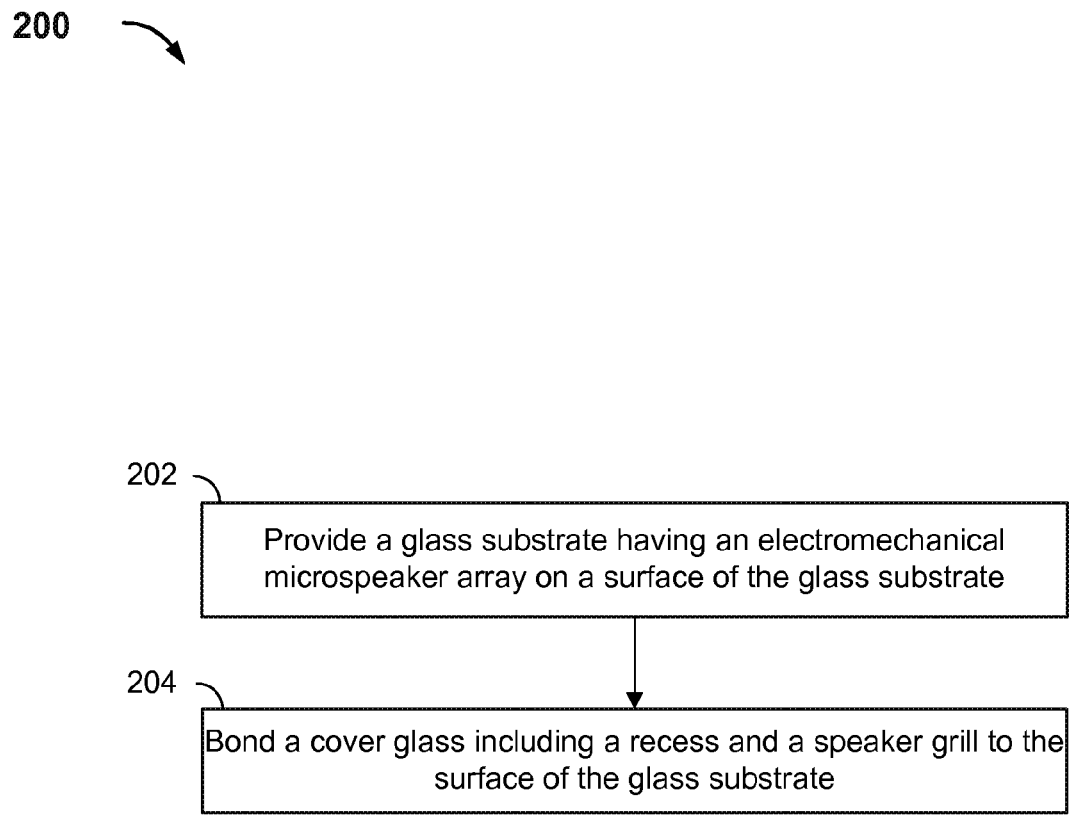
FIG. 11 shows an example of a flow diagram illustrating a manufacturing process for a glass-encapsulated microspeaker.

FIG. 11 shows an example of a flow diagram illustrating a manufacturing process for a glass-encapsulated microspeaker. At block 202 of the process 200, a glass substrate having an electromechanical microspeaker array on a surface of the glass substrate is provided. In addition to a microspeaker array, any number of other components such as joining rings, conductive traces, pads, vias, ledge pads, and the like may be present on any surface of or through the glass substrate. An example of a manufacturing process for forming microspeaker elements on the surface of a glass substrate is discussed below with respect to FIG. 18. The glass substrate also may have an integrated circuit device disposed on the surface of the glass substrate. For example, the integrated circuit device may be fabricated directly on the surface of the glass substrate, or added as a separate component and attached to the glass substrate. If present, the integrated circuit device may be configured to drive the microspeaker array. At block 204, a cover glass including a recess and a speaker grill is bonded to the surface of the glass substrate. The recess and speaker grill may be previously formed, for example, with a chemical etching process, a reactive ion etching process or a sandblasting process. In some implementations, ports of a speaker grill can be formed by a laser drilling process using, for example, an ultraviolet or excimer laser. In some implementations, acoustic ports can be formed after a recess is formed. For example, a recess may be formed in a cover glass by an etching process, with examples of the resulting thickness of the etched portion of the cover glass being between about 200 to 300 microns. Ports extending through the etched portion of the cover glass can be formed by laser drilling. Example diameters of laser drilled ports can be between about 10 and 30 microns. As described above, the cover glass may be bonded to the glass substrate with a joining ring that may include any number of different bonding materials. In some implementations, the cover glass is bonded to the glass substrate with an adhesive. In some implementations, the cover glass is bonded to the glass substrate with a UV curable epoxy or a heat-curable epoxy. When epoxy is used to bond the cover glass to the glass substrate, the epoxy may be screened or dispensed around the edges of the cover glass or the glass substrate. Then, the cover glass and the glass substrate may be aligned and pressed together and UV light or heat may be applied to the epoxy to cure the epoxy.

In some implementations, the cover glass is bonded to the glass substrate with a glass frit bond ring. Glass frit may be applied to the glass substrate, cover glass, or both using dispensing, shadow masking, or other appropriate technique. When a glass frit bond ring is used to bond the cover glass to the glass substrate, heat and pressure may be applied to the cover glass, the glass substrate, and the glass frit bond ring when these components are in contact with one another such that glass frit bond ring melts and bonds the two glass pieces.

In some implementations, the cover glass is bonded to the glass substrate with a metal bond ring. When a metal bond ring is used to bond the cover glass to the glass substrate, heat may be applied to the cover glass, the glass substrate, and the metal bond ring when these components are in contact with one another such that metal bond ring melts and bonds the two glass pieces together.

While the process 200 describes an example of a manufacturing process for a glass-encapsulated microspeaker, a plurality of glass-encapsulated microspeakers may be manufactured with the process 200 with or without variations. For example, tens, hundreds, thousands or more microspeaker arrays may be provided on a single glass substrate panel. Likewise, tens, hundreds, thousands or more recesses and speaker grills can be provided in a single cover glass panel. The cover glass panel may be bonded to the surface of the glass substrate panel, forming a sheet of individually packaged glass-encapsulated microspeakers. The glass-encapsulated microspeakers may then be separated from one another, for example, by dicing with a diamond blade or a laser, by a scribe and break process, or other appropriate technique to cut the joined cover glass and glass substrate panels.

Figure 12A:
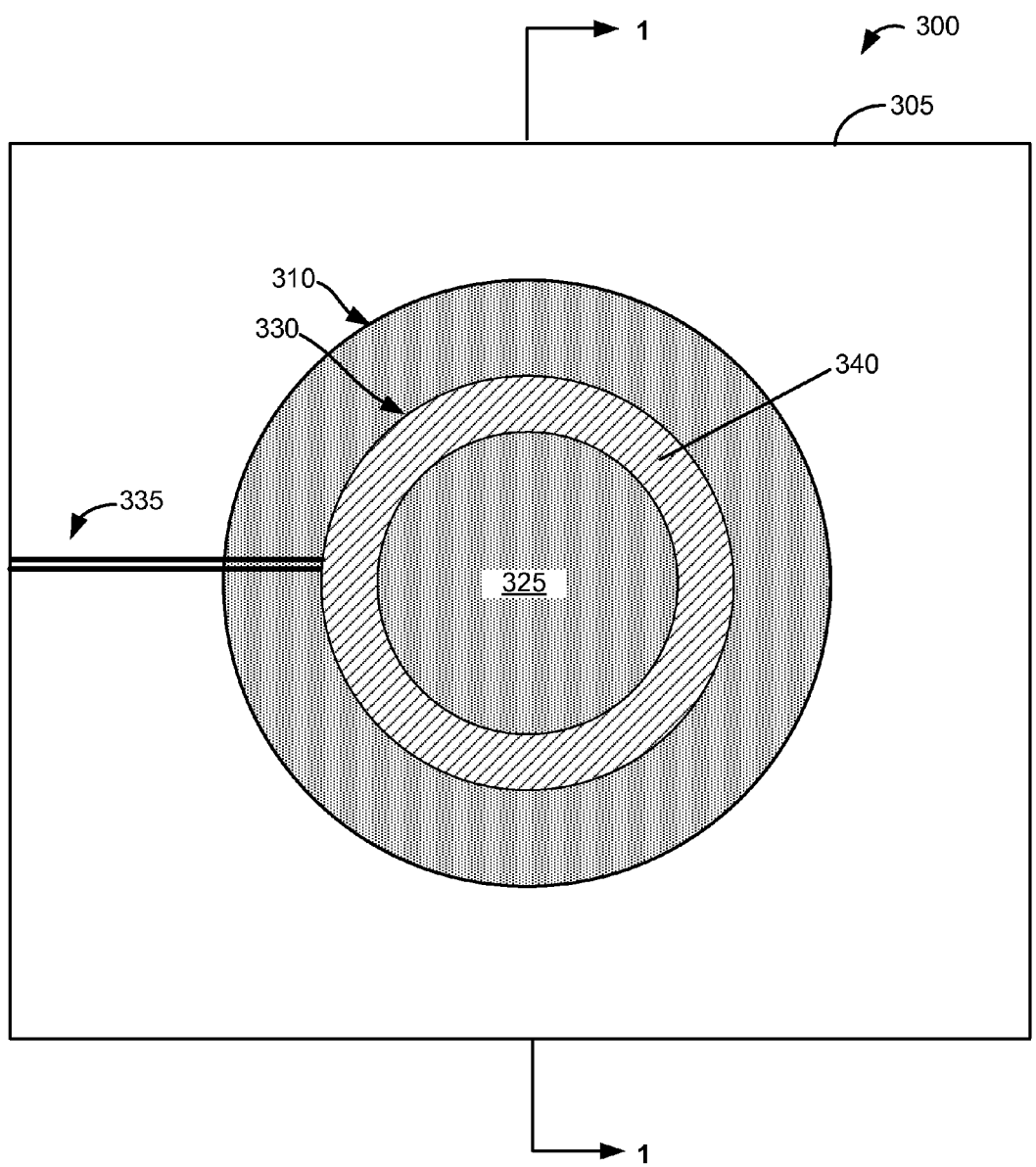
FIGS. 12A-17 show examples of electromechanical microspeaker elements including a deformable dielectric membrane.
Figure 12B:
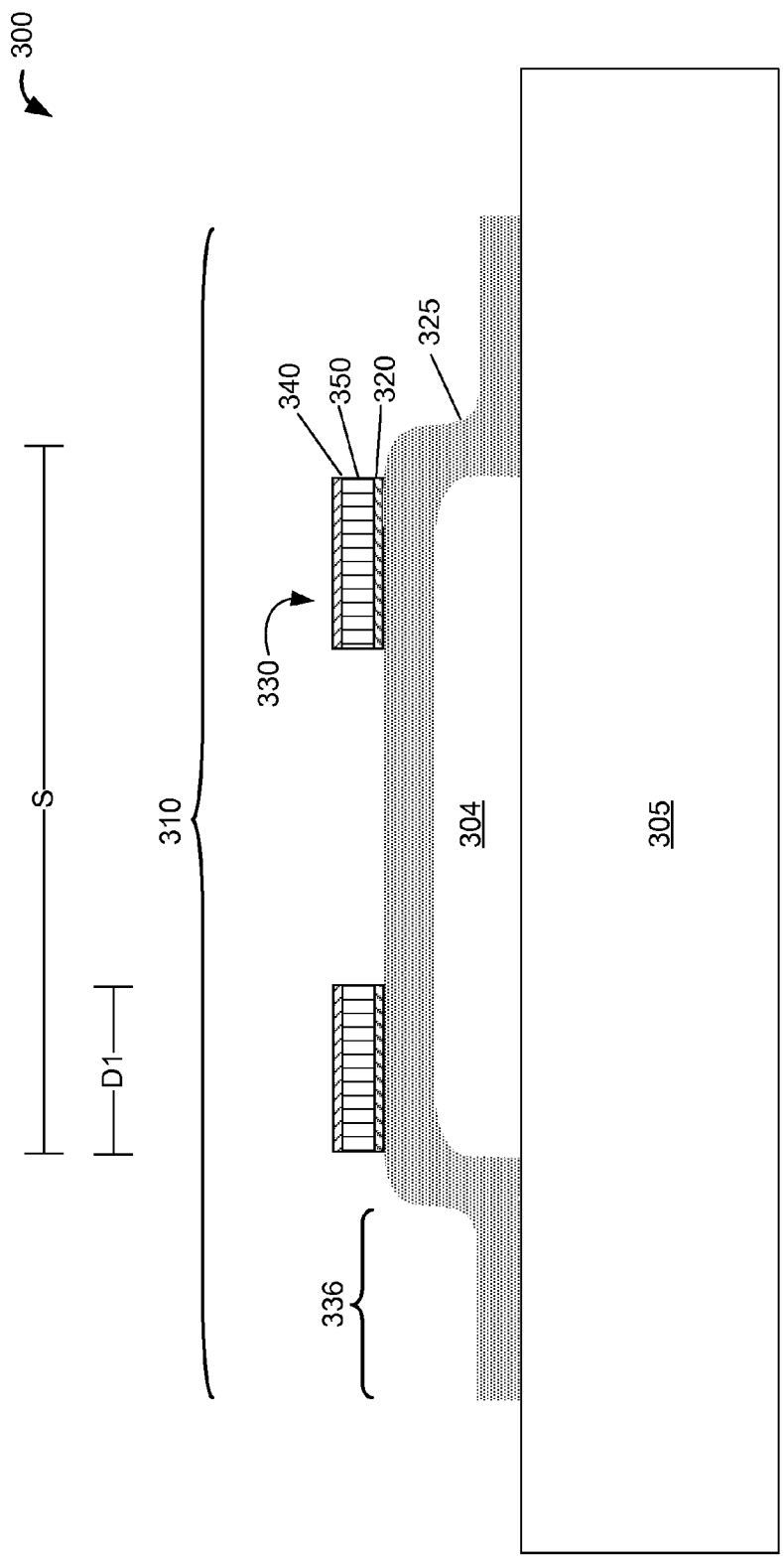

As noted above, a microspeaker array may include any number of individual microspeaker elements. The individual microspeaker elements in the array can be arranged in rows and columns or irregularly such that the overall array is in the shape of a polygon, circle, frame, annulus, or another shape. In some implementations, each microspeaker element includes a deformable dielectric membrane that can deflect upon receiving a driving voltage signal. FIGS. 12A-17 show examples of electromechanical microspeaker elements including a deformable dielectric membrane. FIGS. 12A and 12B show examples of an electromechanical microspeaker element. FIG. 12A shows an example of a top-down view of the microspeaker element 300. FIG. 12B shows an example of a cross-sectional schematic view of the microspeaker element 300 through line 1-1 of FIG. 12A. The microspeaker element 300 shown in FIGS. 12A and 12B includes a substrate 305 and a deformable dielectric membrane 310, which includes a dielectric layer 325 and one or more piezoactuators 330. The piezoactuator 330 may include a piezoelectric material 350 sandwiched between a first electrode 320 and a second electrode 340. A speaker cavity 304 is disposed between the substrate 305 and the deformable dielectric membrane 310. In operation, a driving voltage can be applied across the first electrode 320 and the second electrode 340 to deflect the piezoelectric material 350. The dielectric layer 325 deflects in turn, producing sound. Conductive traces 335 can connect the first and second electrodes 320 and 340 to a driver circuit (not shown), which can be located on or off the substrate 305. In implementations in which the microspeaker element 300 is one of an array of multiple microspeaker elements, the microspeaker element 300 can be connected in parallel with the other microspeaker elements of the array, for example with the first electrode 320 electrically connected to the lower electrodes and the second electrode 340 electrically connected to the upper electrodes of piezoactuators of the other microspeaker elements. Furthermore, in implementations in which the microspeaker element 300 is one of an array of multiple microspeaker elements, each microspeaker element 300 can be driven in phase or with a phase delay and with the same amplitude or different amplitude.

In some implementations, the substrate 305 may be a glass substrate 106 as described above in reference to FIGS. 9A-10B. That is, the microspeaker element 300 may be fabricated on a glass substrate that forms part of a glass-encapsulated microspeaker as described above. In some implementations, the microspeaker element 300 may be fabricated on a glass substrate, with that glass substrate incorporated into a glass-encapsulated microspeaker as described above or otherwise packaged. In some implementations, the substrate 305 can be a non-glass substrate such as a plastic, ceramic, silicon, or conductive substrate, with the non-glass substrate incorporated into a glass-encapsulated microspeaker as described above or otherwise packaged. In some implementations, at least the portion of the substrate 305 that defines the speaker cavity 304 is substantially planar and can be unetched. Alternatively, a portion of substrate 305 can be etched or otherwise shaped to form an acoustic cavity underneath the deformable dielectric membrane 310.

In the example depicted in FIG. 12A, the deformable dielectric membrane 310 is circular, however in some other implementations, the deformable dielectric membrane 310 can be any appropriate shape including rectangular, triangular, square-shaped, or oval-shaped. Examples of dielectric materials that may be used include silicon oxides, silicon nitrides, silicon oxynitrides, aluminum nitrides, and aluminum oxides. The thickness of the dielectric layer 325 can be between 1 and 10 microns, for example. The speaker cavity 304 can be between about 1 and 5 microns thick, for example. The distance that the deformable dielectric membrane 310 extends over the speaker cavity 304, also referred to as the span of the deformable dielectric membrane 310, can be between about 100 and 3000 microns in some implementations. A peripheral annular region 336 of the deformable dielectric membrane 310 can be anchored to the substrate 305. In some implementations, the peripheral annular region 336 is anchored all the way around the deformable dielectric membrane 310. In some implementations, the deformable dielectric membrane 310 can be anchored at spaced-apart positions around its circumference.

The speaker cavity 304 can be sealed or open to ambient conditions according to the desired implementation. In some implementations, the speaker cavity 304 is sealed to prevent viscous damping. The speaker cavity 304 can be at vacuum, sub-atmospheric or atmospheric pressure according to the desired implementation. In some implementations, the speaker cavity 304 is substantially enclosed on all sides such that it is a substantially closed volume. For example, a sealed speaker cavity 304 can be defined by the substrate 305 and the deformable dielectric membrane 310 such that it is enclosed on all sides. In another example, a speaker cavity 304 open to ambient can be defined by the substrate 305 and the deformable dielectric membrane 310 such that it is substantially enclosed on all sides. One or more vent holes, for example between deformable dielectric membrane 310 and the substrate 305, can be present to allow pressure equilibration of a speaker cavity 304 that is substantially enclosed on all sides. Vent holes also can be formed in the deformable dielectric membrane 310 and/or the substrate 305.

The first electrode 320 and the second electrode 340 may include one or more of a number of different metals, and combinations thereof. For example, in various implementations, the first and second electrode 320 and 340 may include copper (Cu), nickel (Ni), ruthenium (Ru), tungsten (W), platinum (Pt), molybdenum (Mo), aluminum (Al), titanium (Ti), and/or gold (Au). In some implementations, the first electrode 320 and the second electrode 340 may be each about 100 to 3000 Angstroms thick. The conductive traces 335 can be formed from the same material as first electrode 320 and second electrode 340. The piezoelectric material 350 may be any appropriate material such as aluminum nitride (AlN), zinc oxide (ZnO) or lead zirconate titanate (PZT). Example thicknesses of the piezoelectric material may be between about 1 and 3 microns.

In the example of FIG. 12A, the piezoactuator 330 is shown as an annular ring at or near a peripheral region of the portion of the deformable dielectric membrane 310 that spans the speaker cavity 304. In some implementations, the piezoactuator can be any appropriate shape including rectangular, triangular, square-shaped, or oval-shaped rings, for example. In the example of FIG. 12B, a dimension S representing the span of the deformable dielectric membrane 310 is depicted, as is a dimension D1 representing a distance from the edge of the speaker cavity 304 to the interior diameter of the piezoactuator 330. In some implementations, D1 can be equal to about one-sixth of the dimension S, yet, other ratios, both larger and smaller also can be used, for example. The width of the piezoactuator 330 may or may not be about equal to D1 depending on the desired implementation. Example widths of the piezoactuator 330 range from a few microns to a few hundred microns or more. The piezoactuator 330 may contain one or more segments of piezoelectric material 350 and associated electrodes 320 and 340.

While the piezoactuator 330 shown in FIG. 12B and other Figures is a unimorph piezoactuator, the piezoactuators of the microspeaker elements described herein may alternatively be a bimorph piezoactuator. Bimorph piezoactuators may include two electrode/piezoelectric/electrode stacks separated by an elastic layer. Examples of elastic layers include silicon nitrides, silicon oxynitrides, silicon oxides, and aluminum nitrides.

Figure 13A:
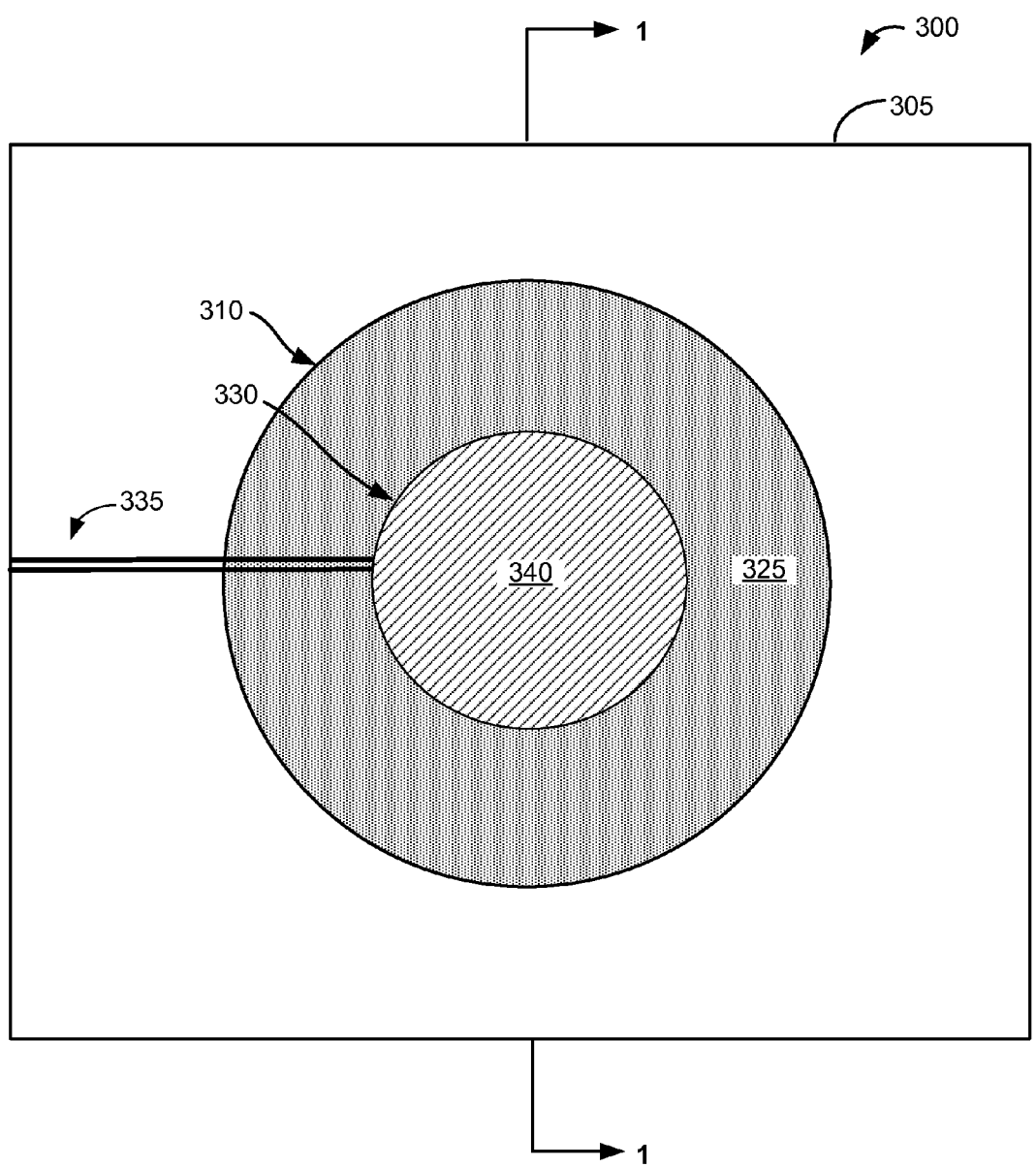
Figure 13B:
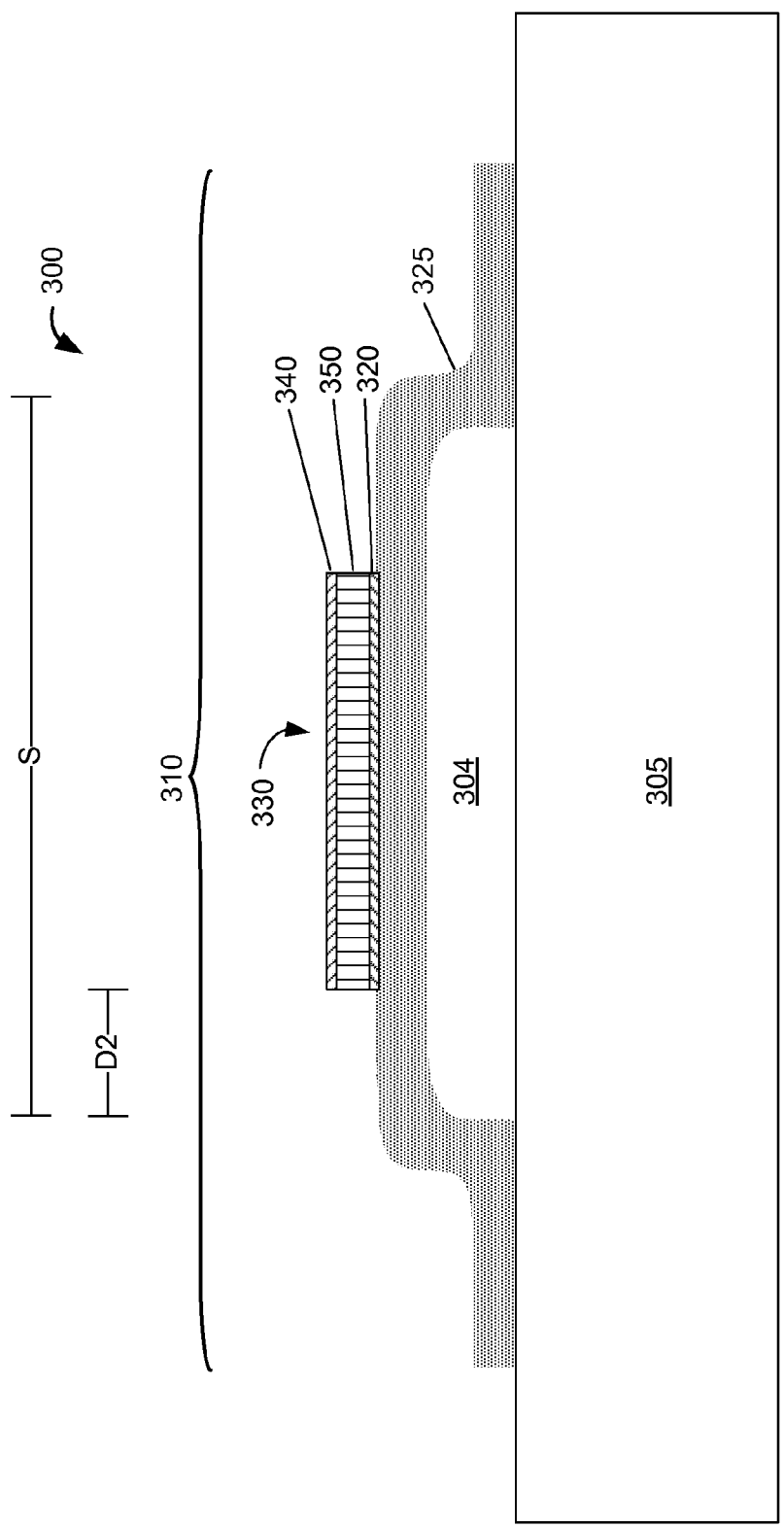

In some implementations, the microspeaker elements described herein leave a region of the dielectric layer exposed to allow the dielectric layer to contract and expand in response to a driving signal. For example, annular piezoactuators, such as the piezoactuator 330 depicted in FIGS. 12A and 12B, leave a center region of the dielectric layer 325 exposed. FIGS. 13A and 13B show examples of an electromechanical microspeaker element that includes a piezoactuator that occupies a center region of the deformable dielectric membrane. FIG. 13A shows an example of a top-down view of the microspeaker element 300. FIG. 13B shows an example of a cross-sectional schematic view of the microspeaker element 300 through line 1-1 of FIG. 13A. The microspeaker element 300 shown in FIGS. 13A and 13B includes a substrate 305, a speaker cavity 304, a deformable dielectric membrane 310, and one or more conductive traces 335, as described above with respect to FIGS. 12A and 12B. The deformable dielectric membrane 310 includes a piezoactuator 330 and a dielectric layer 325. The piezoactuator 330 occupies a center region of the deformable dielectric membrane 310, leaving a peripheral region of the dielectric layer 325 uncovered by the piezoactuator 330. The piezoactuator 330 includes a piezoelectric material 350 sandwiched between a first electrode 320 and a second electrode 340.

In the example depicted in FIG. 13A, the piezoactuator 330 is circular, however in some other implementations, the piezoactuator 330 can be any appropriate shape including rectangular, triangular, square-shaped, or oval-shaped. In the example of FIG. 13B, a dimension S representing the span of the deformable dielectric membrane is depicted, as is a dimension D2 representing a distance from the edge of the speaker cavity 304 to the exterior diameter of the piezoactuator 330. In some implementations, D2 can be equal to about one-sixth of the dimension S, yet, other ratios, both larger and smaller also can be used, for example.

Figure 14A:
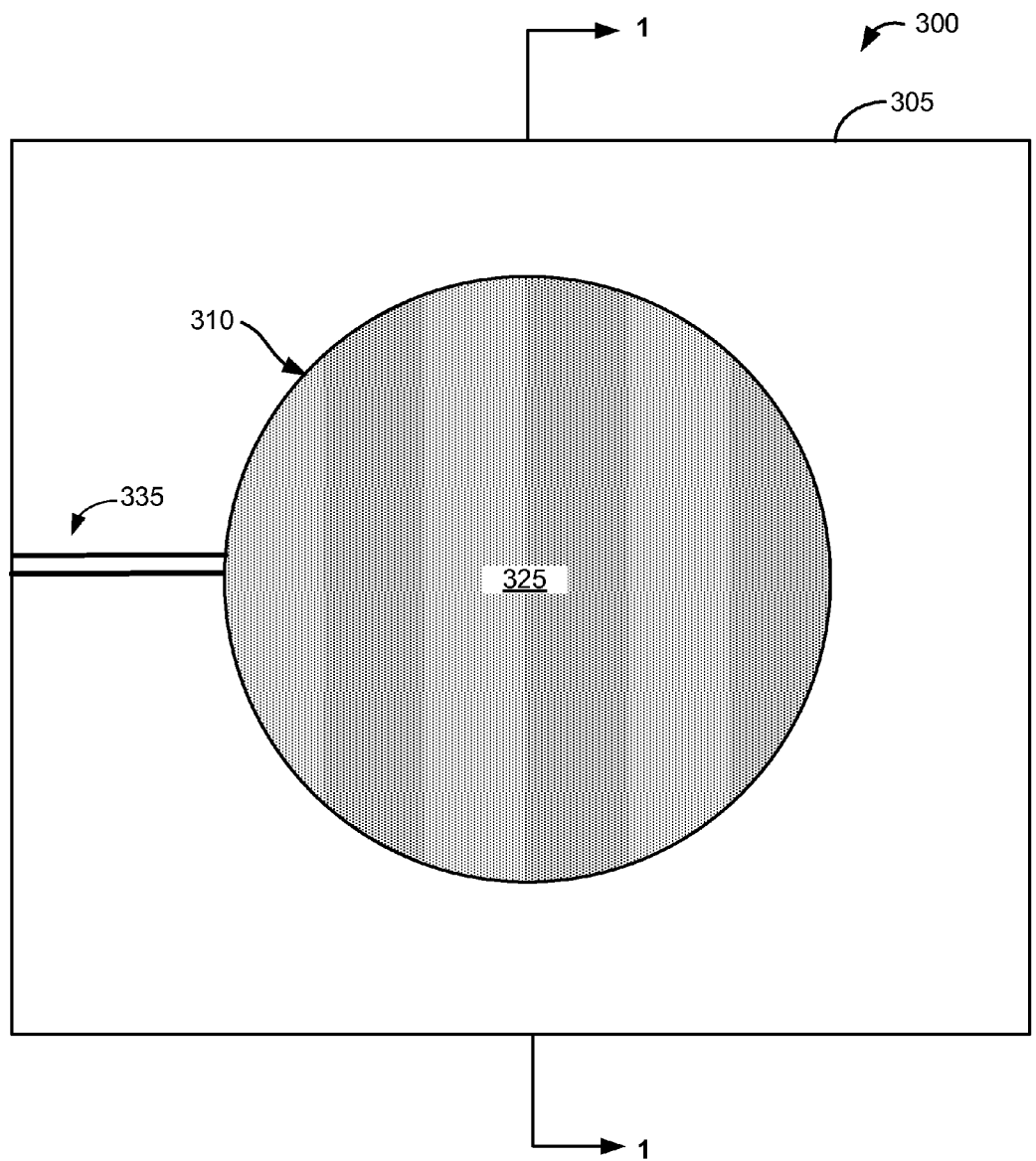
Figure 14B:
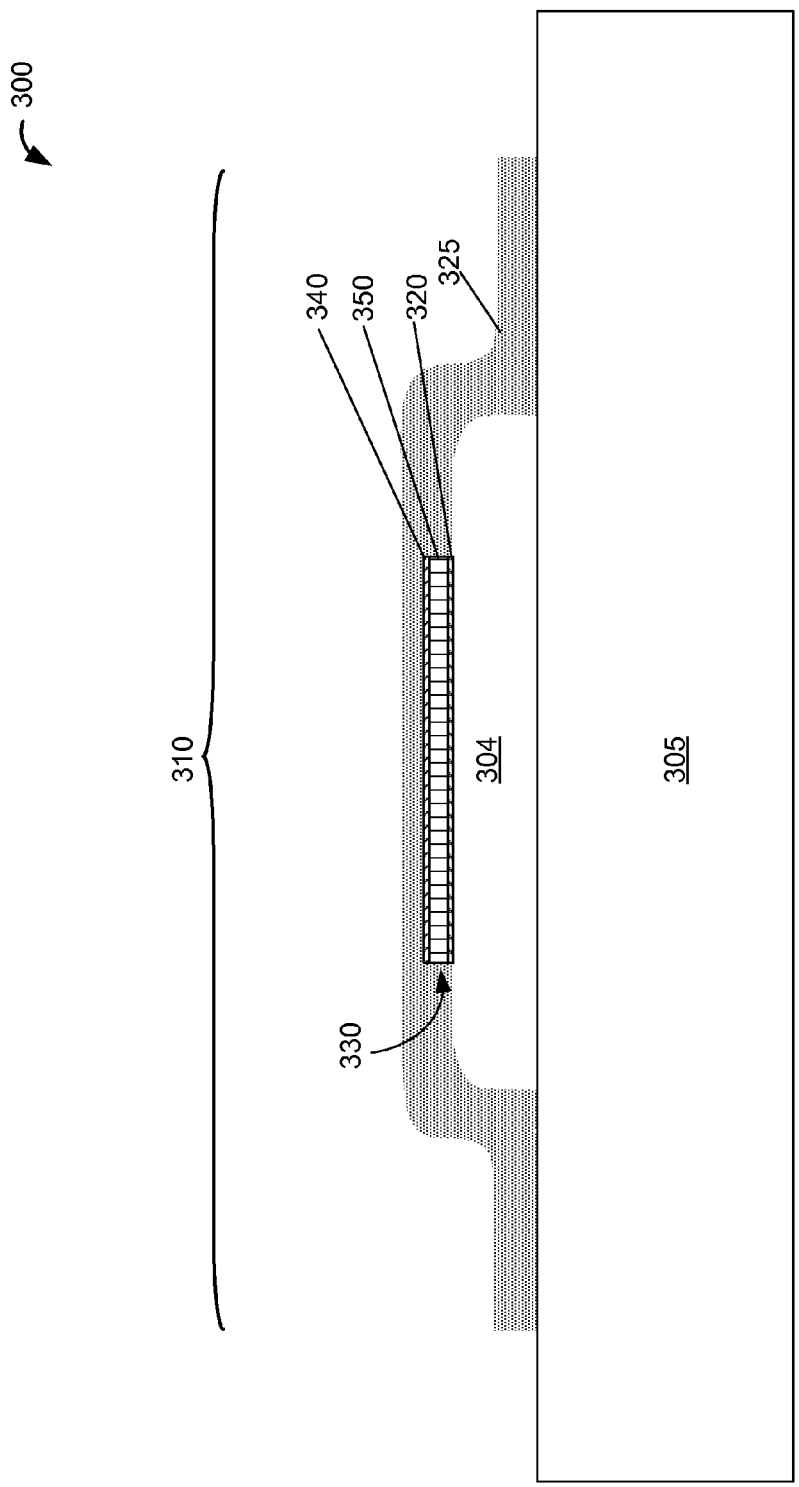

FIGS. 14A and 14B show examples of an electromechanical microspeaker element that includes a "buried" piezoactuator. FIG. 14A shows an example of a top-down view of the microspeaker element 300. FIG. 14B shows an example of a cross-sectional schematic view of the microspeaker element 300 through line 1-1 of FIG. 14A. The microspeaker element 300 shown in FIGS. 14A and 14B includes a substrate 305, a speaker cavity 304, a deformable dielectric membrane 310, and one or more conductive traces 335, as described above with respect to FIGS. 12A and 12B. The deformable dielectric membrane 310 includes a dielectric layer 325 and a center-positioned piezoactuator 330. The piezoactuator 330 includes a piezoelectric material 350 sandwiched between a first electrode 320 and a second electrode 340. In the example of FIGS. 14A and 14B, the piezoactuator 330 is disposed between the speaker cavity 304 and the dielectric layer 325. In some implementations, burying the piezoactuator 330 can allow the dielectric layer 325 to protect the piezoactuator 330 from humidity and other environmental conditions. A piezoactuator that is located at or near the periphery of the cavity, such as depicted in FIGS. 12A and 12B, also can be buried.

Figure 15:
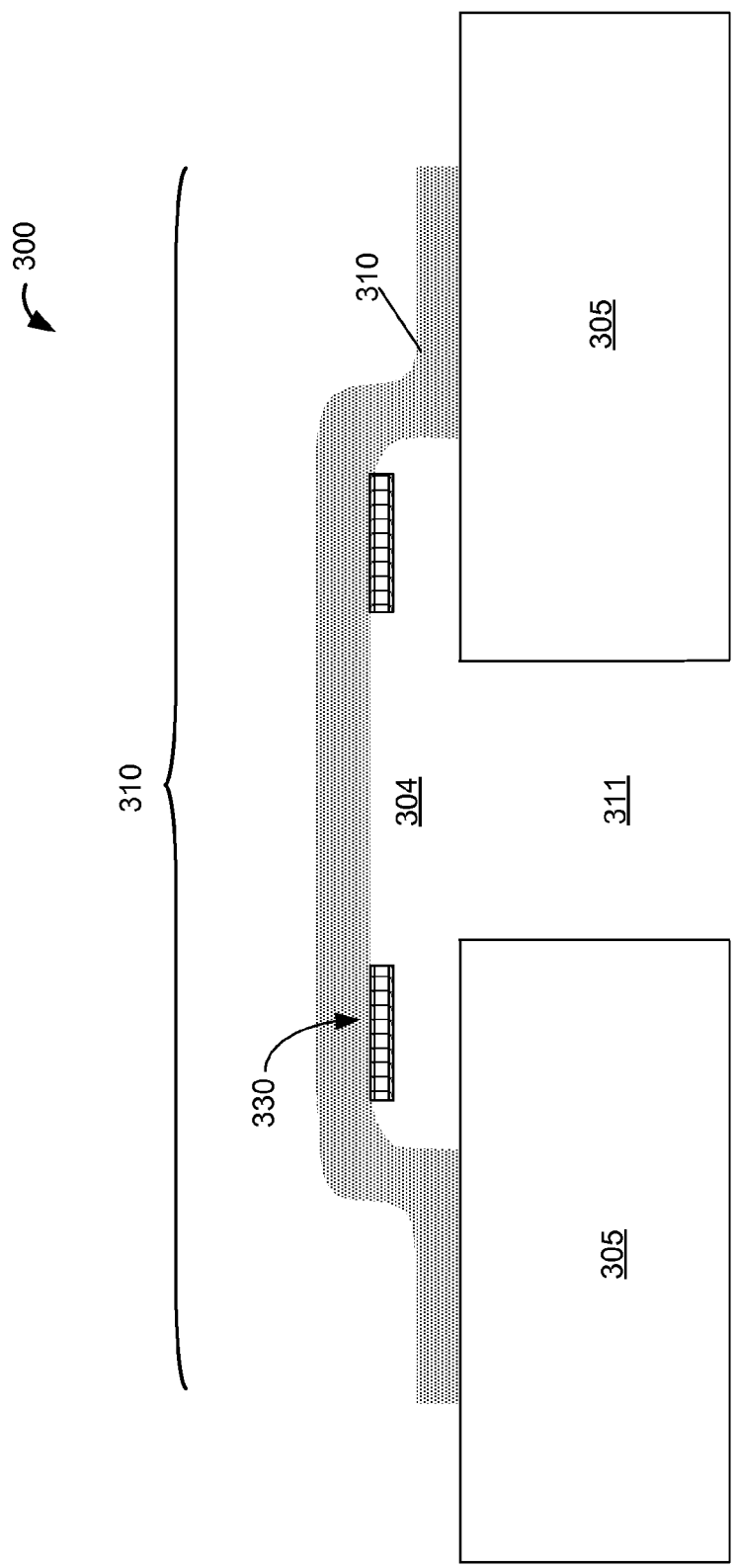

In some implementations, the microspeaker element can include an acoustic cavity that can improve speaker response to the driving signal, particularly at low frequencies. FIG. 15 shows an example of an electromechanical microspeaker element connected to an acoustic cavity. The microspeaker element 300 includes a substrate 305, a deformable dielectric membrane 310, and a speaker cavity 304, with the deformable dielectric membrane 310 including a dielectric layer 325 and a piezoactuator 330. The speaker cavity 304 is connected to an acoustic cavity 311, which is formed in and extends through the substrate 305.

Figure 16A:
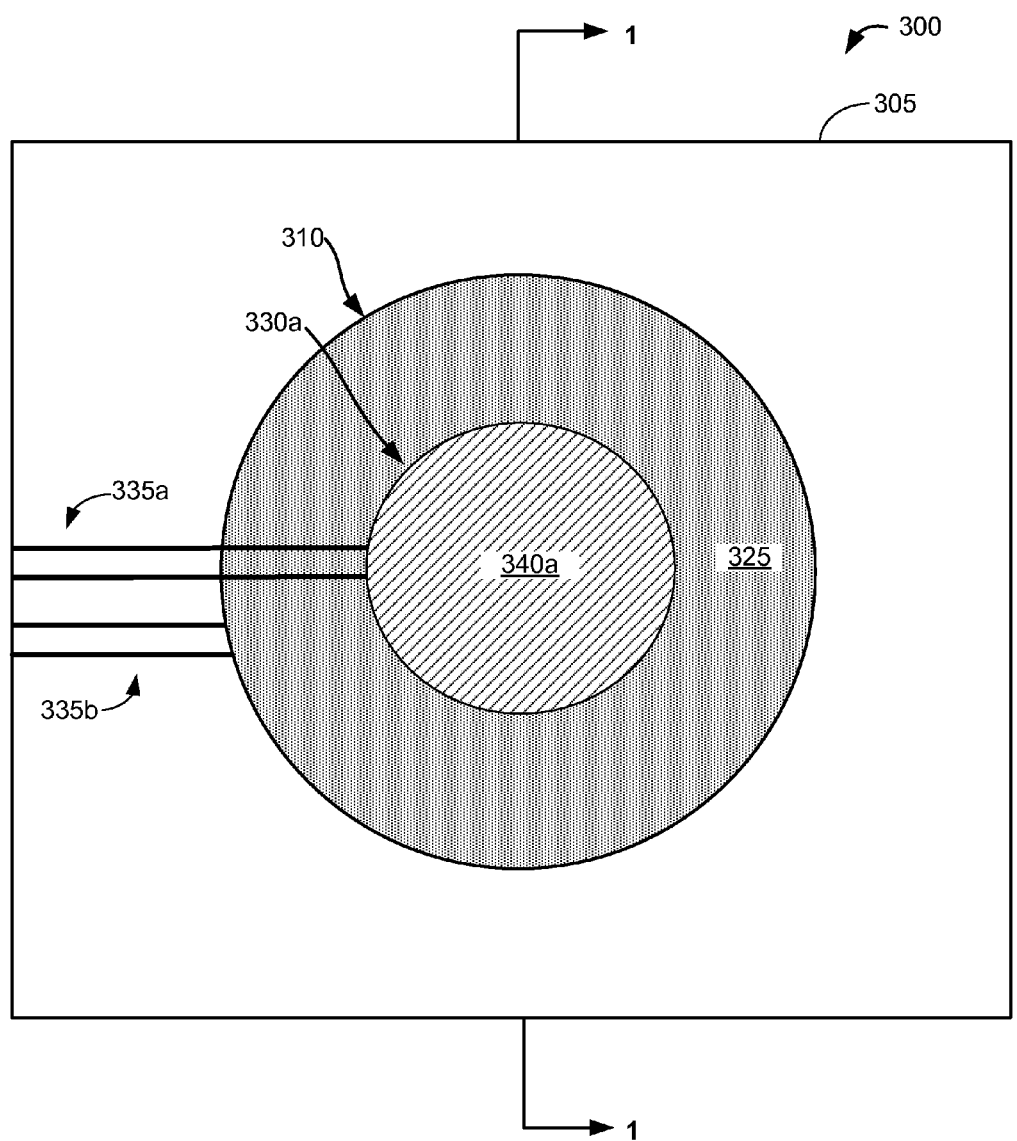
Figure 16B:
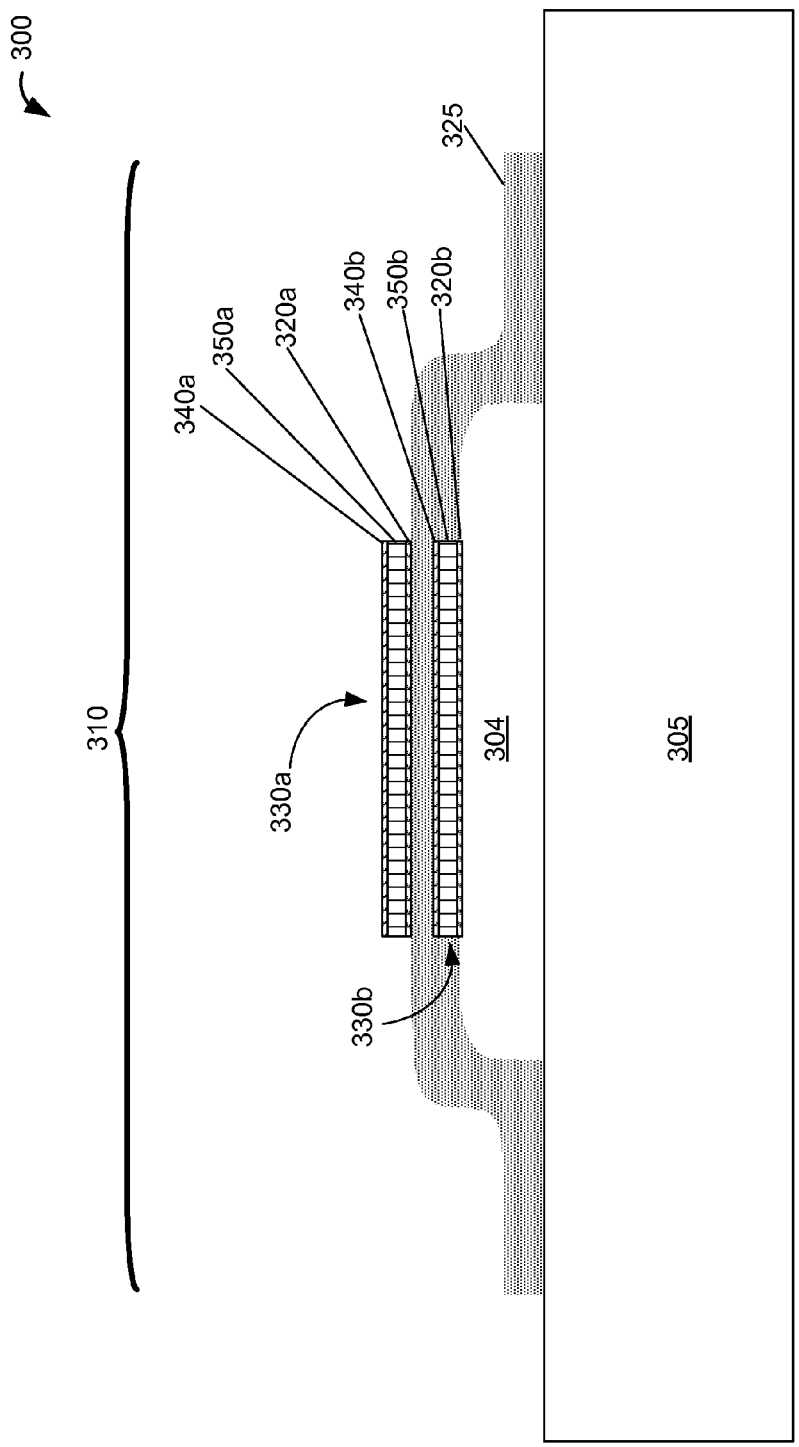
Figure 16C:
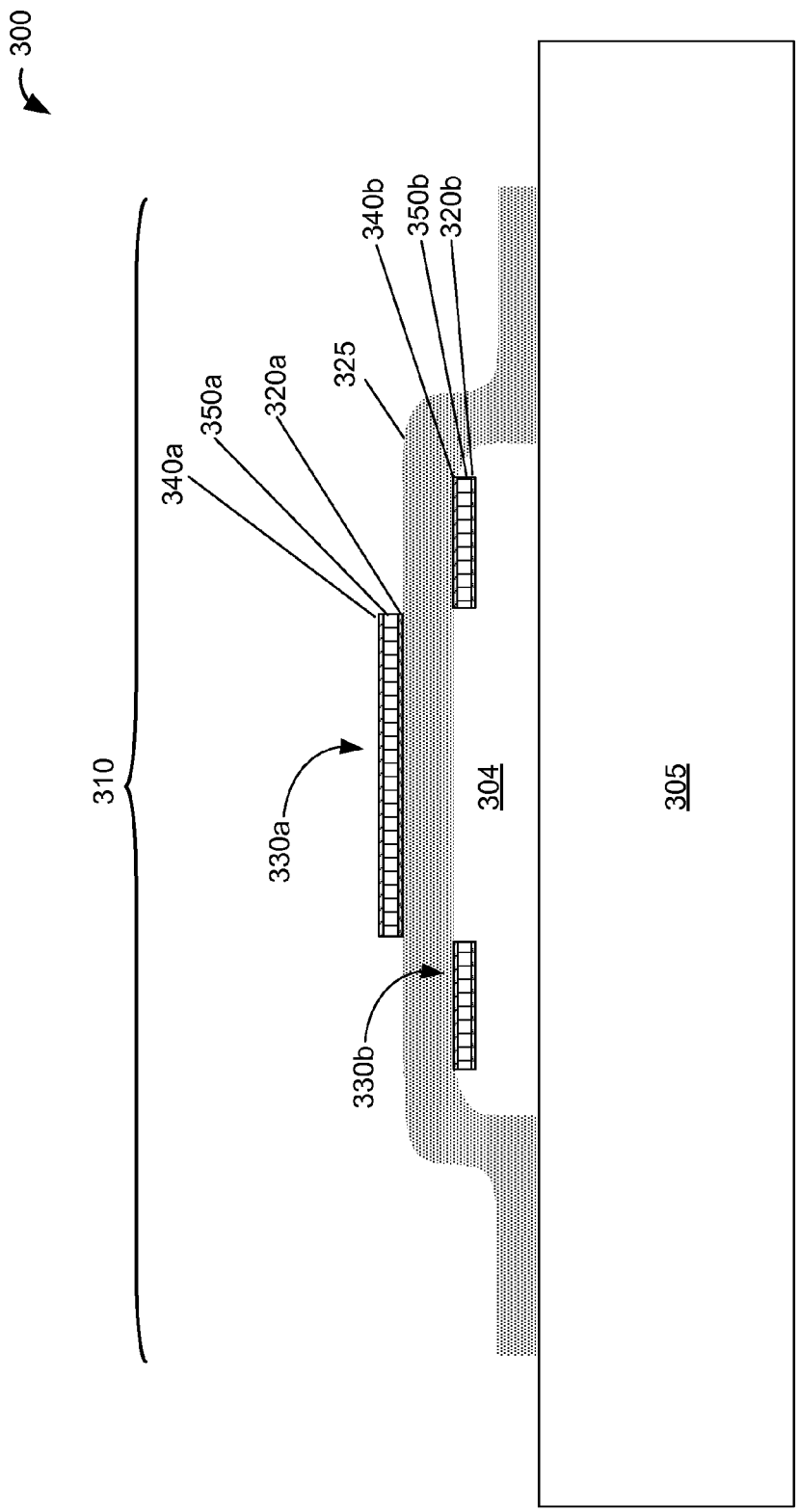

In some implementations, the microspeaker element can include piezoactuators on both sides of the dielectric layer. FIGS. 16A-16C show examples of an electromechanical microspeaker element that includes piezoactuators on both sides of a dielectric layer of the deformable dielectric layer. FIG. 16A shows an example of a top-down view of the microspeaker element 300. FIGS. 16B and 16C show examples of cross-sectional schematic views of the microspeaker element 300 through line 1-1 of FIG. 16A. The microspeaker element 300 shown in FIGS. 16A-16C includes a substrate 305, a speaker cavity 304, and a deformable dielectric membrane 310. The deformable dielectric membrane 310 includes a dielectric layer 325, a first piezoactuator 330a and a second piezoactuator 330b. The first piezoactuator 330a includes a first electrode 320a, a first piezoelectric layer 350a, and a second electrode 340a. The second piezoactuator 330b includes a third electrode 320b, a second piezoelectric layer 350b, and a fourth electrode 340b. Conductive traces 335a and 335b can connect the first piezoactuator 330a and second piezoactuator 330b, respectively, to a driver circuit (not shown). In some implementations, the first piezoactuator 330a and the second piezoactuator 330b can be separately driven. In some implementations, the first piezoactuator 330a and the second piezoactuator 330b can be in a push/pull mode, with equal and opposite responses to the driving signal. In some implementations, one or more electrodes are connected to ground. For example, the inner electrodes, i.e., the first electrode 320a and the fourth electrode 340b, can be connected to ground.

The first and second piezoactuators can independently be positioned at the center or at the periphery of the deformable dielectric membrane. In the example of FIG. 16B, the first piezoactuator 330a and the second piezoactuator 330b both occupy center regions of the deformable dielectric membrane 310. In the example of FIG. 16C, the first piezoactuator 330a is centered, while the second piezoactuator 330b is located at or near the periphery of the portion of the deformable dielectric membrane 310 that spans the speaker cavity 304.

Figure 17:
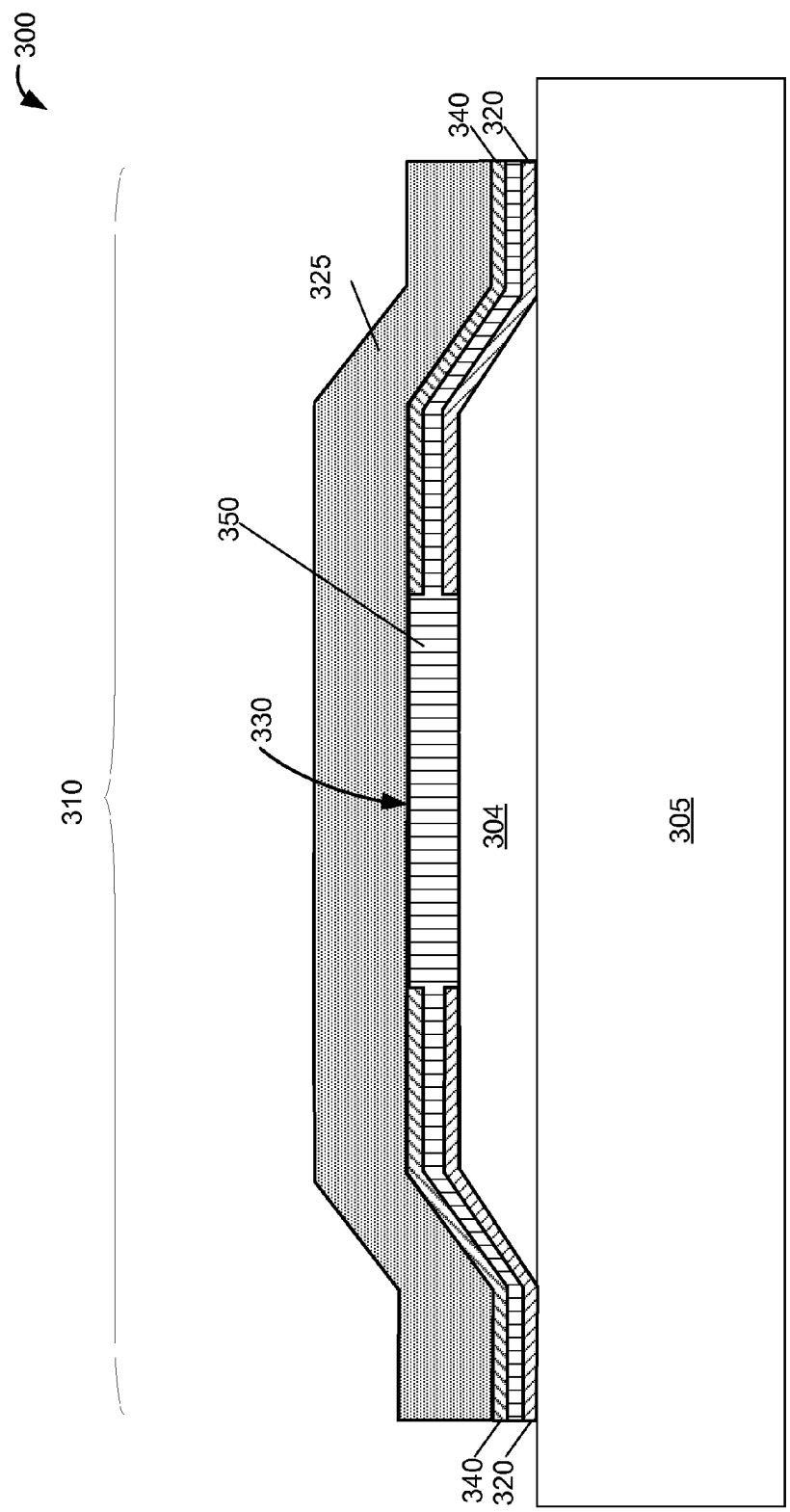

In some implementations, the microspeaker can include a piezoactuator that spans the cavity of the microspeaker. FIG. 17 shows an example of an electromechanical microspeaker element 300 including a deformable dielectric membrane 310 on a substrate 305. The deformable dielectric membrane includes a dielectric layer 325 and a piezoactuator 330. The piezoactuator 330 includes a first electrode 320, a piezoelectric layer 350, and a second electrode 340. Both the dielectric layer 325 and portions of the piezoactuator 330 span the speaker cavity 304. The first electrode 320 and second electrode 340 extend around the periphery of the deformable dielectric membrane 310. Alternatively, the first electrode 320 and second electrode 340 may be positioned in the center of the deformable dielectric membrane 310, one on the top and the other on the bottom of the piezoelectric layer 350. The piezoactuator 330 in FIG. 17 is buried under the dielectric layer 325. In other implementations, the piezoactuator can be on top of the dielectric layer such that the dielectric layer is disposed between the speaker cavity and the piezoactuator.

FIG. 18 shows an example of a flow diagram illustrating a manufacturing process for a microspeaker element. Note that the operations of the method 400 may be combined and/or rearranged to form any of the microspeaker elements disclosed herein. Note also that the patterning and etching of the different layers, as described below, may be performed to achieve different patterns of the layers in different regions of a microspeaker element. Because the operations of the method 400 may be performed at about room temperature to 400° C. (i.e., the processes of the method may be performed at about 400° C. or lower), the method 400 is compatible with glass and flat-panel display glass technologies.

At block 402, a sacrificial layer is formed on a substrate. As described above, the substrate may be a glass substrate that forms a glass-encapsulated microspeaker or a glass or non-glass substrate that may be bonded to the glass substrate that forms a glass-encapsulated microspeaker or is otherwise packaged. Prior to forming the sacrificial layer on the glass substrate, the substrate can be metallized to form through-glass vias, conductive traces, bond pads, ledge pads, and the like. In some implementations, an oxide or a nitride may be deposited to passivate the metal.

The formation of the sacrificial layer may include deposition of a sacrificial material by an appropriate deposition technique such as sputtering, evaporation, or CVD. Examples of sacrificial materials include gas-etchable materials such as Mo, MoCr, amorphous Si, or polycrystalline Si. The sacrificial layer is removed in subsequent processing to form a speaker cavity, such as speaker cavity 304 in FIG. 14B; accordingly, it is deposited to a thickness of the desired size of the speaker cavity, which may be about 1 to 5 microns. The formation of the sacrificial layer can further include patterning the sacrificial material after deposition to form a desired shape of the cavity. To form a microspeaker element 300 in FIG. 14B, for example, the sacrificial material can be patterned to form a circular shape. In some implementations, formation of sacrificial layers for an array of microspeaker elements, or for a plurality of arrays of microspeaker elements, can be performed simultaneously by depositing and patterning a film of sacrificial material across a substrate or portion thereof. The sacrificial material may be patterned using lithography and etching processes used in integrated circuit manufacturing as known by a person having ordinary skill in the art.

At block 404, a piezoactuator is formed over the sacrificial layer. In some implementations, formation of the piezoactuator can involve deposition and patterning of a first electrode layer/piezoelectric layer/second electrode layer stack over the sacrificial layer to form the piezoactuator in a desired shape. To form a piezoactuator 330 as shown in FIG. 14B, for example, the first electrode/piezoelectric layer/second electrode stack can be patterned to form a circular shape. One or conductive traces for each of the first and second electrode can be deposited and patterned during deposition and patterning of the associated electrode. Patterning, including lithography and etching as known to a person having ordinary skill in the art, can be performed after deposition of each layer or only after deposition of the first electrode layer/piezoelectric layer/second electrode layer stack according to the desired implementation. In some implementations, formation of the first electrode and second electrode layers may include deposition of a metal such as Cu, Ni, Ru, W, Pt, Mo, Al, Ti, and/or Au by an appropriate deposition process such as sputtering or evaporation.

In some implementations, formation of the piezoelectric layer can include deposition of polyvinylidene fluoride (PVDF), aluminum nitride (AlN), lead zirconate titanate (Pb[$Zr_x Ti_{1-x}$]$O_3$, 0≤x≤1), gallium arsenide (GaAs), zinc oxide (ZnO), or other appropriate material by a reactive ion sputtering process, a direct current (DC) sputtering process, or other appropriate process. In some implementations, formation of piezoactuators for an array of microspeaker elements, or for a plurality of arrays of microspeaker elements, can be performed simultaneously by depositing and patterning a film of sacrificial material across a substrate or portion thereof.

At block 406, a dielectric layer is formed over the sacrificial layer. Examples of dielectric materials include silicon oxides, silicon nitrides, silicon oxynitrides, aluminum nitrides, and aluminum oxides. Formation of the dielectric layer can include deposition of the dielectric material by thermal CVD, PECVD technique, or other appropriate deposition technique. Formation of the dielectric layer can further include patterning the deposited dielectric material. A portion of the dielectric layer may be formed on the glass substrate to provide support for the portion of the dielectric layer formed over the sacrificial layer. As with the sacrificial layer and piezoactuator, formation of dielectric layers for an array of microspeaker elements, or for a plurality of arrays of microspeaker elements, can be performed simultaneously.

According to various implementations, block 404 can be performed prior to or after block 406. For example, to form a microspeaker element 300 as depicted in the example of FIG. 12B, block 404 may be performed after block 406, such that the piezoactuator is formed on the dielectric layer. In some implementations, block 404 may be performed prior to and after block 406.

At block 408, the sacrificial layer is removed. In some implementations, removing the sacrificial layer involves exposing it to an etchant. For example, a gas-etchable material such as Mo or amorphous Si may be removed by dry chemical etching with vapors derived from solid XeF2 or other fluorine-based etchant. Other combinations of etchable sacrificial material and etching methods, such as wet etching and/or plasma etching, also may be used.

As indicated above, various modifications can be made to the method 400 to form any of the microspeaker elements described herein. In implementations of microspeaker elements including non-piezoelectric elastic layers, an elastic layer including silicon nitride (SiN), silicon oxynitride (SiON), silicon oxide ($SiO_2$), silicon (Si), aluminum nitride (AlN), a metal, or a polymer, for example, may be formed using an appropriate processing technique, as know by a person having ordinary skill in the art. For example, an elastic layer may be formed with a sputtering process, a chemical vapor deposition (CVD) process, a physical vapor deposition (PVD) process, or an electroplating process.

As indicated above, in some implementations, a glass package as described herein can be part of a display device. In some other implementations, non-display devices fabricated on glass substrates can be compatible with displays and other devices that are also fabricated on glass substrates, with the non-display devices fabricated jointly with a display device or attached as a separate device, the combination having well-matched thermal expansion properties.

Figure 19A:
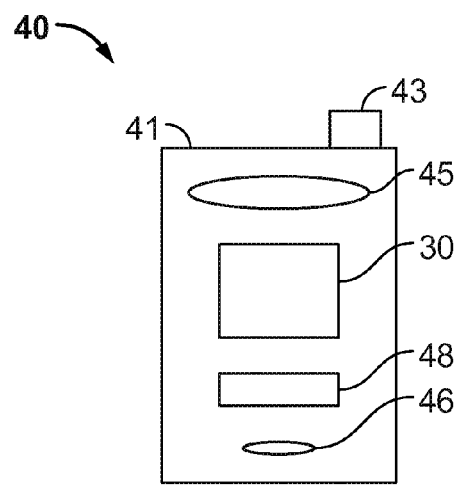
FIGS. 19A and 19B show examples of system block diagrams illustrating a display device that includes a plurality of IMODs.
Figure 19B:
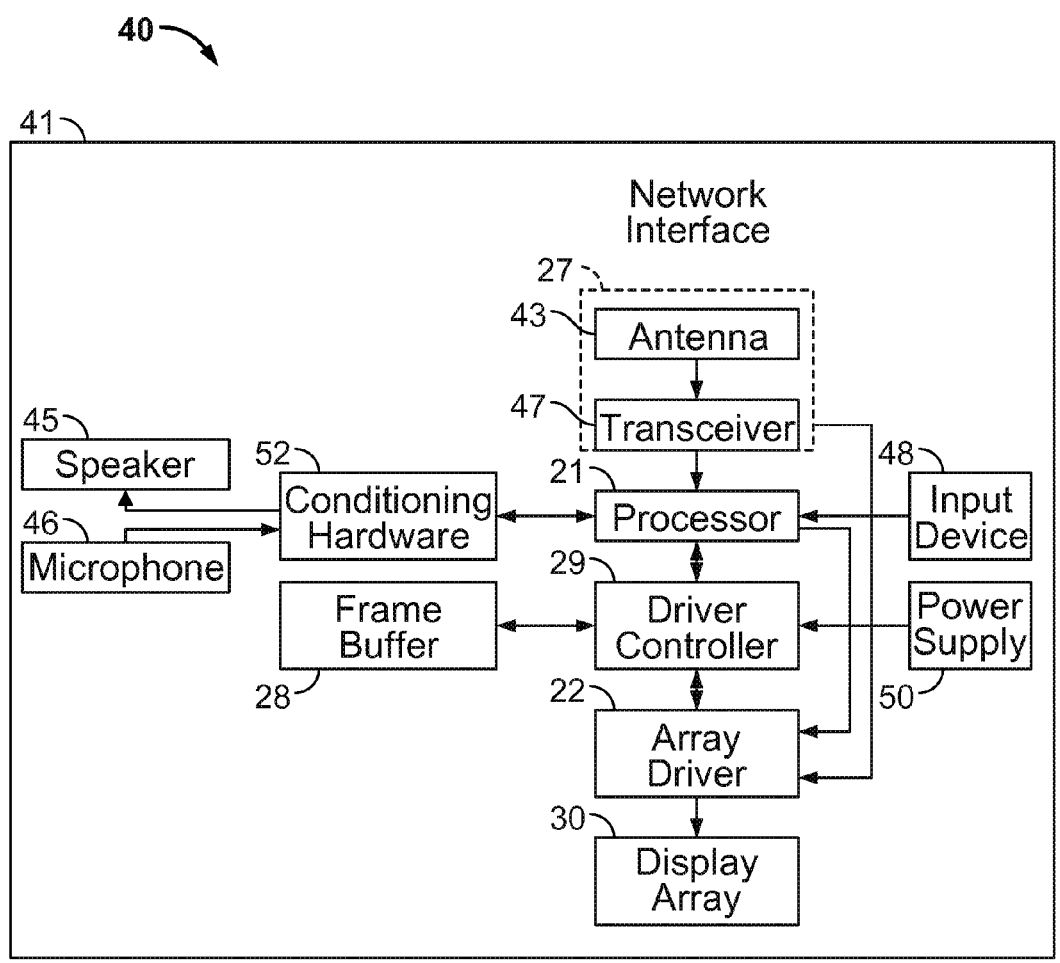

FIGS. 19A and 19B show examples of system block diagrams illustrating a display device 40 that includes a plurality of IMODs. The display device 40 can be, for example, a smart phone, a cellular or mobile telephone. However, the same components of the display device 40 or slight variations thereof are also illustrative of various types of display devices such as televisions, tablets, e-readers, hand-held devices and portable media players.

The display device 40 includes a housing 41, a display 30, an antenna 43, a speaker 45, an input device 48 and a microphone 46. The housing 41 can be formed from any of a variety of manufacturing processes, including injection molding, and vacuum forming. In addition, the housing 41 may be made from any of a variety of materials, including, but not limited to: plastic, metal, glass, rubber and ceramic, or a combination thereof. The housing 41 can include removable portions (not shown) that may be interchanged with other removable portions of different color, or containing different logos, pictures, or symbols.

The display 30 may be any of a variety of displays, including a bi-stable or analog display, as described herein. The display 30 also can be configured to include a flat-panel display, such as plasma, EL, OLED, STN LCD, or TFT LCD, or a non-flat-panel display, such as a CRT or other tube device. In addition, the display 30 can include an IMOD display, as described herein.

The components of the display device 40 are schematically illustrated in FIG. 19B. The display device 40 includes a housing 41 and can include additional components at least partially enclosed therein. For example, the display device 40 includes a network interface 27 that includes an antenna 43 which is coupled to a transceiver 47. The transceiver 47 is connected to a processor 21, which is connected to conditioning hardware 52. The conditioning hardware 52 may be configured to condition a signal (e.g., filter a signal). The conditioning hardware 52 is connected to a speaker 45 and a microphone 46. The processor 21 is also connected to an input device 48 and a driver controller 29. The driver controller 29 is coupled to a frame buffer 28, and to an array driver 22, which in turn is coupled to a display array 30. In some implementations, a power supply 50 can provide power to substantially all components in the particular display device 40 design.

The network interface 27 includes the antenna 43 and the transceiver 47 so that the display device 40 can communicate with one or more devices over a network. The network interface 27 also may have some processing capabilities to relieve, for example, data processing requirements of the processor 21. The antenna 43 can transmit and receive signals. In some implementations, the antenna 43 transmits and receives RF signals according to the IEEE 16.11 standard, including IEEE 16.11(a), (b), or (g), or the IEEE 802.11 standard, including IEEE 802.11a, b, g, n, and further implementations thereof. In some other implementations, the antenna 43 transmits and receives RF signals according to the BLUETOOTH standard. In the case of a cellular telephone, the antenna 43 is designed to receive code division multiple access (CDMA), frequency division multiple access (FDMA), time division multiple access (TDMA), Global System for Mobile communications (GSM), GSM/General Packet Radio Service (GPRS), Enhanced Data GSM Environment (EDGE), Terrestrial Trunked Radio (TETRA), Wideband-CDMA (W-CDMA), Evolution Data Optimized (EV-DO), 1×EV-DO, EV-DO Rev A, EV-DO Rev B, High Speed Packet Access (HSPA), High Speed Downlink Packet Access (HSDPA), High Speed Uplink Packet Access (HSUPA), Evolved High Speed Packet Access (HSPA+), Long Term Evolution (LTE), AMPS, or other known signals that are used to communicate within a wireless network, such as a system utilizing 3G or 4G technology. The transceiver 47 can pre-process the signals received from the antenna 43 so that they may be received by and further manipulated by the processor 21. The transceiver 47 also can process signals received from the processor 21 so that they may be transmitted from the display device 40 via the antenna 43.

In some implementations, the transceiver 47 can be replaced by a receiver. In addition, in some implementations, the network interface 27 can be replaced by an image source, which can store or generate image data to be sent to the processor 21. The processor 21 can control the overall operation of the display device 40. The processor 21 receives data, such as compressed image data from the network interface 27 or an image source, and processes the data into raw image data or into a format that is readily processed into raw image data. The processor 21 can send the processed data to the driver controller 29 or to the frame buffer 28 for storage. Raw data typically refers to the information that identifies the image characteristics at each location within an image. For example, such image characteristics can include color, saturation and gray-scale level.

The processor 21 can include a microcontroller, CPU, or logic unit to control operation of the display device 40. The conditioning hardware 52 may include amplifiers and filters for transmitting signals to the speaker 45, and for receiving signals from the microphone 46. The conditioning hardware 52 may be discrete components within the display device 40, or may be incorporated within the processor 21 or other components.

The driver controller 29 can take the raw image data generated by the processor 21 either directly from the processor 21 or from the frame buffer 28 and can re-format the raw image data appropriately for high speed transmission to the array driver 22. In some implementations, the driver controller 29 can re-format the raw image data into a data flow having a raster-like format, such that it has a time order suitable for scanning across the display array 30. Then the driver controller 29 sends the formatted information to the array driver 22. Although a driver controller 29, such as an LCD controller, is often associated with the system processor 21 as a stand-alone Integrated Circuit (IC), such controllers may be implemented in many ways. For example, controllers may be embedded in the processor 21 as hardware, embedded in the processor 21 as software, or fully integrated in hardware with the array driver 22.

The array driver 22 can receive the formatted information from the driver controller 29 and can re-format the video data into a parallel set of waveforms that are applied many times per second to the hundreds, and sometimes thousands (or more), of leads coming from the display's x-y matrix of pixels.

In some implementations, the driver controller 29, the array driver 22, and the display array 30 are appropriate for any of the types of displays described herein. For example, the driver controller 29 can be a conventional display controller or a bi-stable display controller (such as an IMOD controller). Additionally, the array driver 22 can be a conventional driver or a bi-stable display driver (such as an IMOD display driver). Moreover, the display array 30 can be a conventional display array or a bi-stable display array (such as a display including an array of IMODs). In some implementations, the driver controller 29 can be integrated with the array driver 22. Such an implementation can be useful in highly integrated systems, for example, mobile phones, portable-electronic devices, watches or small-area displays.

In some implementations, the input device 48 can be configured to allow, for example, a user to control the operation of the display device 40. The input device 48 can include a keypad, such as a QWERTY keyboard or a telephone keypad, a button, a switch, a rocker, a touch-sensitive screen, a touch-sensitive screen integrated with display array 30, or a pressure- or heat-sensitive membrane. The microphone 46 can be configured as an input device for the display device 40. In some implementations, voice commands through the microphone 46 can be used for controlling operations of the display device 40.

The power supply 50 can include a variety of energy storage devices. For example, the power supply 50 can be a rechargeable battery, such as a nickel-cadmium battery or a lithium-ion battery. In implementations using a rechargeable battery, the rechargeable battery may be chargeable using power coming from, for example, a wall socket or a photovoltaic device or array. Alternatively, the rechargeable battery can be wirelessly chargeable. The power supply 50 also can be a renewable energy source, a capacitor, or a solar cell, including a plastic solar cell or solar-cell paint. The power supply 50 also can be configured to receive power from a wall outlet.

In some implementations, control programmability resides in the driver controller 29 which can be located in several places in the electronic display system. In some other implementations, control programmability resides in the array driver 22. The above-described optimization may be implemented in any number of hardware and/or software components and in various configurations.

The various illustrative logics, logical blocks, modules, circuits and algorithm steps described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and steps described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, a plurality of microprocessors, one or more microprocessors in conjunction with a DSP core, or any other such configuration. In some implementations, particular steps and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

If implemented in software, the functions may be stored on or transmitted over as one or more instructions or code on a computer-readable medium. The steps of a method or algorithm disclosed herein may be implemented in a processor-executable software module which may reside on a computer-readable medium. Computer-readable media includes both computer storage media and communication media including any medium that can be enabled to transfer a computer program from one place to another. A storage media may be any available media that may be accessed by a computer. By way of example, and not limitation, such computer-readable media may include RAM, ROM, EEPROM, CD-ROM or other optical disk storage, magnetic disk storage or other magnetic storage devices, or any other medium that may be used to store desired program code in the form of instructions or data structures and that may be accessed by a computer. Also, any connection can be properly termed a computer-readable medium. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above also may be included within the scope of computer-readable media. Additionally, the operations of a method or algorithm may reside as one or any combination or set of codes and instructions on a machine readable medium and computer-readable medium, which may be incorporated into a computer program product.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein. The word "exemplary" is used exclusively herein to mean "serving as an example, instance, or illustration." Any implementation described herein as "exemplary" is not necessarily to be construed as preferred or advantageous over other possibilities or implementations. Additionally, a person having ordinary skill in the art will readily appreciate, the terms "upper" and "lower" are sometimes used for ease of describing the figures, and indicate relative positions corresponding to the orientation of the figure on a properly oriented page, and may not reflect the proper orientation of an IMOD as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, a person having ordinary skill in the art will readily recognize that such operations need not be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. An apparatus, comprising:
a substrate;
a deformable membrane; and
a cavity disposed between the substrate and the deformable membrane such that the deformable membrane spans the cavity,
the deformable membrane including a first piezoelectric layer between first and second metal layers, and a dielectric layer, wherein the dielectric layer is capable of deforming on application of a drive voltage across the first piezoelectric layer to thereby generate an ultrasonic wave, wherein the cavity is a sealed cavity that is enclosed on all sides, and wherein the dielectric layer is directly engaged with the substrate.

2. The apparatus of claim 1, wherein the dielectric layer includes at least one of an oxide, nitride or oxynitride material.

3. The apparatus of claim 1, wherein the first piezoelectric layer includes at least one of polyvinylidene fluoride (PVDF), aluminum nitride (AlN), lead zirconate titanate ($Pb[Zr_xTi_{1-x}]O_3$, $0 \leq x \leq 1$), gallium arsenide (GaAs) or zinc oxide (ZnO).

4. The apparatus of claim 1, wherein the first piezoelectric layer is disposed between the dielectric layer and the substrate.

5. The apparatus of claim 1, wherein the dielectric layer is disposed between the first piezoelectric layer and the substrate.

6. The apparatus of claim 1, wherein the first piezoelectric layer spans the cavity.

7. The apparatus of claim 1, wherein the first piezoelectric layer is centered over the cavity.

8. The apparatus of claim 1, wherein the first piezoelectric layer overlies a peripheral region of the cavity.

9. The apparatus of claim 1, wherein the deformable membrane further includes a second piezoelectric layer sandwiched between third and fourth metal layers.

10. The apparatus of claim 9, wherein the first and second piezoelectric layers are located on opposite sides of the dielectric layer.

11. The apparatus of claim 1, wherein the substrate is a glass substrate.

12. The apparatus of claim 1, wherein the cavity is defined by a portion of the substrate and the deformable membrane and wherein the portion of the substrate that defines the cavity is planar.

13. An apparatus, comprising:
a substrate;
a deformable membrane; and
a cavity disposed between the substrate and the deformable membrane such that the deformable membrane spans the cavity,
the deformable membrane including a first piezoelectric layer between first and second metal layers, and a dielectric layer, wherein the dielectric layer is capable of deforming on application of a drive voltage across the first piezoelectric layer to thereby generate an ultrasonic wave, wherein the cavity is a sealed cavity that is enclosed on all sides, and wherein the dielectric layer extends over the entire area of the cavity.

14. The apparatus of claim 13, wherein the dielectric layer includes at least one of an oxide, nitride or oxynitride material.

15. The apparatus of claim 13, wherein the first piezoelectric layer includes at least one of polyvinylidene fluoride (PVDF), aluminum nitride (AlN), lead zirconate titanate ($Pb[Zr_xTi_{1-x}]O_3$, $0 \leq x \leq 1$), gallium arsenide (GaAs) or zinc oxide (ZnO).

16. The apparatus of claim 13, wherein the first piezoelectric layer is disposed between the dielectric layer and the substrate.

17. The apparatus of claim 13, wherein the dielectric layer is disposed between the first piezoelectric layer and the substrate.

18. The apparatus of claim 13, wherein the first piezoelectric layer spans the cavity.

19. The apparatus of claim 13, wherein the first piezoelectric layer is centered over the cavity.

20. The apparatus of claim 13, wherein the first piezoelectric layer overlies a peripheral region of the cavity.

* * * * *